(12) United States Patent
Cha et al.

(10) Patent No.: US 9,865,597 B2
(45) Date of Patent: Jan. 9, 2018

(54) SEMICONDUCTOR DEVICE HAVING FIN AND DUAL LINER

(71) Applicant: SAMSUNG ELECTRONICS CO., LTD.

(72) Inventors: Ji-Hoon Cha, Seoul (KR); Sang-Woo Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/847,994

(22) Filed: Sep. 8, 2015

(65) Prior Publication Data

US 2017/0069630 A1   Mar. 9, 2017

(51) Int. Cl.
| | | |
|---|---|---|
| H01L 21/70 | (2006.01) | |
| H01L 27/092 | (2006.01) | |
| H01L 29/06 | (2006.01) | |
| H01L 29/161 | (2006.01) | |
| H01L 21/8238 | (2006.01) | |

(52) U.S. Cl.
CPC .. *H01L 27/0924* (2013.01); *H01L 21/823807* (2013.01); *H01L 21/823821* (2013.01); *H01L 27/0922* (2013.01); *H01L 29/0649* (2013.01); *H01L 29/161* (2013.01); *H01L 21/823878* (2013.01)

(58) Field of Classification Search
CPC ..................... H01L 27/0922; H01L 27/0924
USPC ...................................................... 257/369
See application file for complete search history.

(56) References Cited

U.S. PATENT DOCUMENTS

| | | | |
|---|---|---|---|
| 7,902,014 B2 | 3/2011 | Doyle et al. | |
| 8,809,947 B1 | 8/2014 | Akarvardar et al. | |
| 8,835,262 B2 | 9/2014 | Cai et al. | |
| 8,847,281 B2 | 9/2014 | Cea et al. | |
| 9,443,935 B2 * | 9/2016 | Oh | H01L 29/66477 |
| 2007/0111448 A1 * | 5/2007 | Li | H01L 21/823821 438/264 |
| 2013/0270641 A1 * | 10/2013 | Chi | H01L 21/823821 257/351 |
| 2013/0299951 A1 | 11/2013 | Tung | |
| 2014/0117462 A1 | 5/2014 | Cheng et al. | |
| 2014/0170839 A1 | 6/2014 | Brunco | |
| 2014/0367795 A1 * | 12/2014 | Cai | H01L 27/0886 257/392 |
| 2014/0374807 A1 | 12/2014 | Jacob et al. | |
| 2015/0187915 A1 * | 7/2015 | Joo | H01L 29/66492 438/289 |

\* cited by examiner

*Primary Examiner* — Marc Armand
*Assistant Examiner* — Wilner Jean Baptiste
(74) *Attorney, Agent, or Firm* — F. Chau & Associates, LLC

(57) ABSTRACT

A semiconductor device is provided as follows. A first fin is formed on a first region of a substrate, extending in a first direction. A second fin is formed on a second region of the substrate, extending in a second direction. A first dual liner is formed on a lateral surface of the first fin. The first dual liner includes a first liner and a second liner. The first liner is interposed between the second liner and the lateral surface of the first fin. A second dual liner is formed on a lateral surface of the second fin. The second dual liner includes a third liner and a fourth liner. The third liner is interposed between the fourth liner and the lateral surface of the second fin. An epitaxial layer surrounds a top portion of the second fin. The first liner and the third liner have different thicknesses.

20 Claims, 19 Drawing Sheets

SEMICONDUCTOR DEVICE HAVING FIN AND DUAL LINER

TECHNICAL FIELD

The present inventive concept relates to a semiconductor device.

DISCUSSION OF RELATED ART

As semiconductor devices are becoming highly integrated, gate all around structures are used. In the gate all around structure, active regions are shaped of a nanowire, and a gate of the gate all around structure surrounds the nanowire.

Since the gate all around structures are formed in a three-dimensional channel, scaling is easily achieved. In addition, current controlling capability may be increased without increasing a two-dimensional width of the gate. Further, a short channel effect (SCE) in which a potential of a channel region is affected by drain voltage may be suppressed.

SUMMARY

According to an exemplary embodiment of the present inventive concept, a semiconductor device is provided as follows. A substrate includes a first region and a second region. A first fin is formed on the first region, extending in a first direction. A second fin is formed on the second region, extending in a second direction. A first dual liner is formed on a lateral surface of the first fin. The first dual liner includes a first liner and a second liner. The first liner is interposed between the second liner and the lateral surface of the first fin. A second dual liner is formed on a lateral surface of the second fin. The second dual liner includes a third liner and a fourth liner. The third liner is interposed between the fourth liner and the lateral surface of the second fin. An epitaxial layer surrounds a top portion of the second fin. The first liner and the third liner have different thicknesses.

According to an exemplary embodiment of the present inventive concept, a semiconductor device is provided as follows. A substrate includes a first region and a second region. A first fin is formed on the first region, extending in a first direction. A second fin is formed on the second region, extending in a second direction. A first dual liner is formed on a lateral surface of the first fin. The first dual liner includes a first liner and a second liner. The first liner is interposed between the second liner and the later surface of the first fin. A second dual liner is formed on a lateral surface of the second fin. The second dual liner includes a third liner and a fourth liner. The third liner is interposed between the fourth liner and the lateral surface of the second fin. An epitaxial layer surrounds a top portion of the second fin. A first gate structure is in contact with the first fin, intersecting the first fin and extending in a third direction crossing the first direction. A second gate structure is in contact with a top surface of the epitaxial layer, intersecting the epitaxial layer in a fourth direction crossing the second direction. A first width of the second fin is different from a first width of the first fin. The first width of the first fin is measured at a first height above a top surface of the first dual liner and the first width of the second fin is measured at a second height above a top surface of the second dual liner.

According to an exemplary embodiment of the present inventive concept, a semiconductor device is provided as follows. A substrate includes a first region and a second region. A first fin is formed on the first region, extending in a first direction. A second fin is formed on the second region, extending in a second direction. A first liner is formed on a lateral surface of the first fin. A second liner is formed on a lateral surface of the first liner. An epitaxial layer surrounds a top portion of the second fin. The first liner and the second liner have different thicknesses. A first width of the second fin is different a first width of the first fin. The first width of the first fin is measured at a first height above a top surface of the first liner. The first width of the second fin is measured at a second height above a top surface of the second liner.

According to an exemplary embodiment of the present inventive concept, a semiconductor device is provided as follows. A first fin is formed on a substrate. A second fin is formed on the substrate. A first dual liner is formed on a bottom portion of the first fin, covering the bottom portion of the first fin. A second dual liner is formed on a bottom portion of the second fin, covering the bottom portion of the second fin. An epitaxial layer is formed on a top portion of the second fin. A gate insulation layer is formed on a top portion of the first fin and the epitaxial layer. A boundary between the bottom portion of the first fin and the top portion of the first fin is at a first height from the substrate. A boundary between the bottom portion of the second fin and the top portion of the second fin is at a second height from the substrate. A total thickness of the epitaxial layer and the top portion of the second fin is substantially the same with a width of the top portion of the first fin.

BRIEF DESCRIPTION OF THE DRAWINGS

These and other features of the inventive concept will become more apparent by describing in detail exemplary embodiments thereof with reference to the accompanying drawings of which.

Figure 1:
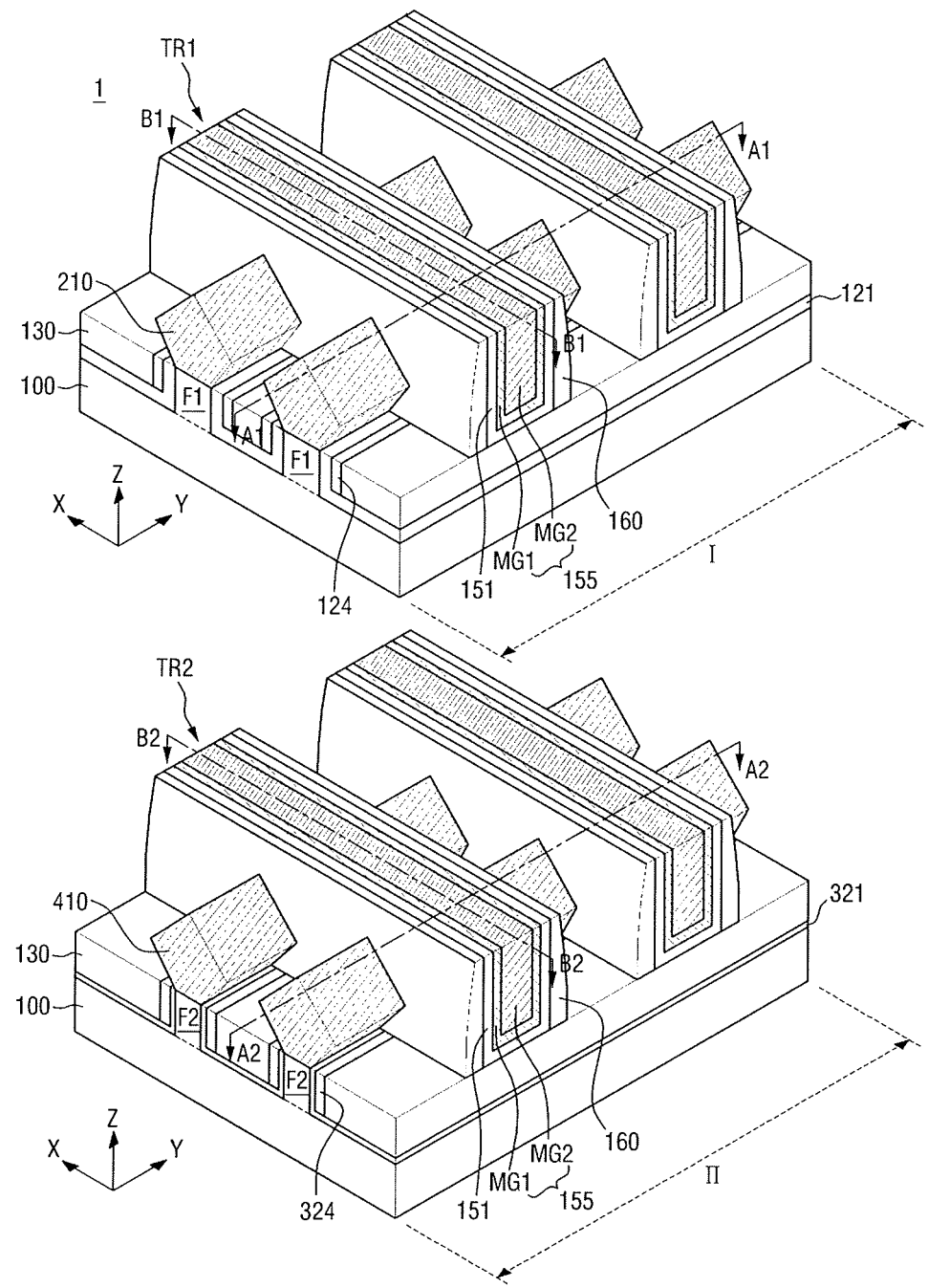
FIG. 1 is a perspective view of a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a semiconductor device according to an exemplary embodiment of the present inventive concept will be described with reference to FIGS. 1 to 31.

Figure 2:
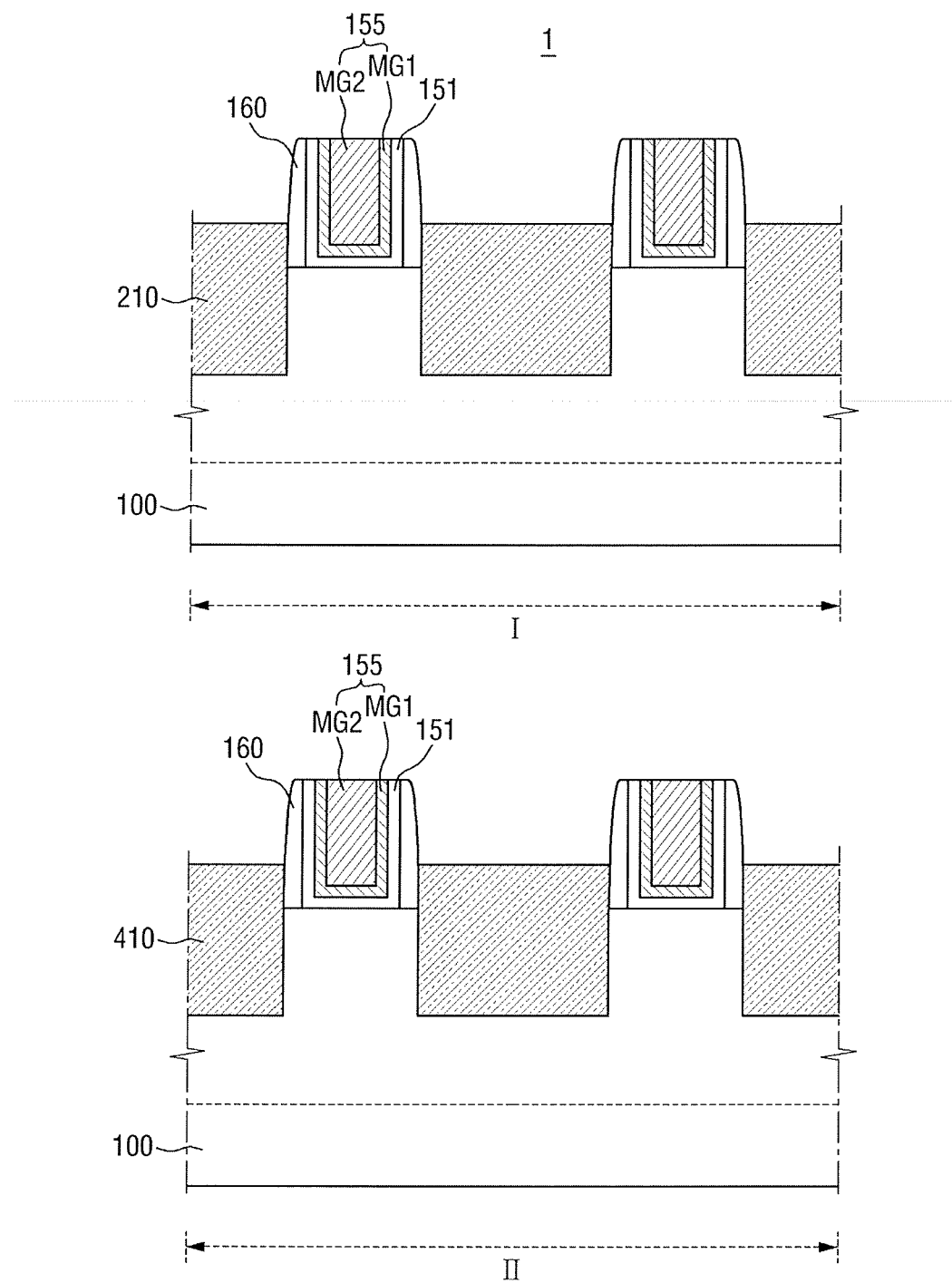
FIG. 2 is a cross-sectional view taken along lines A1-A1 and A2-A2 of FIG. 1.
Figure 3:
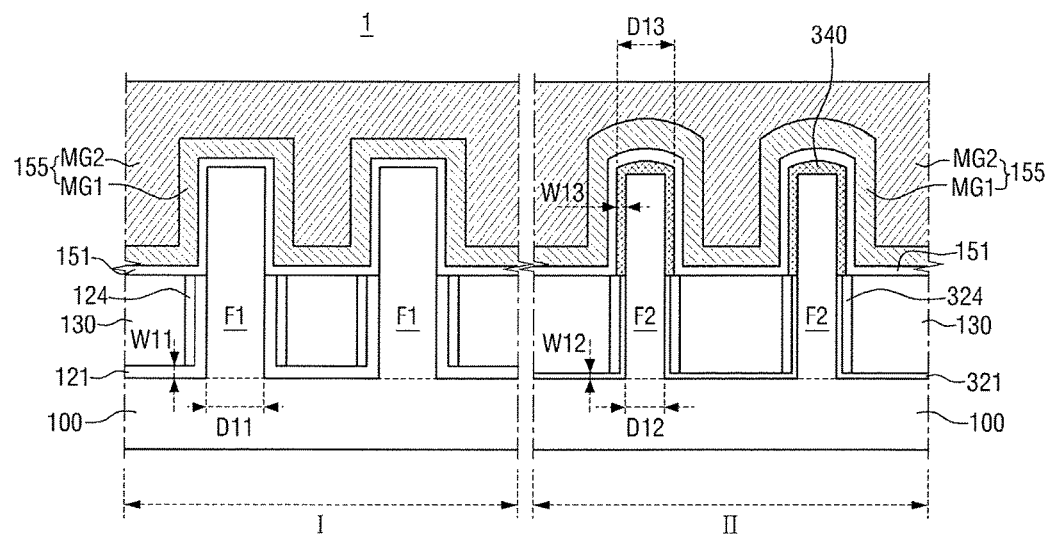
FIG. 3 is a cross-sectional view taken along lines B1-B1 and B2-B2 of FIG. 1.

FIG. 1 is a perspective view of a semiconductor device according to an exemplary embodiment of the present inventive concept, FIG. 2 is a cross-sectional view taken along lines A1-A1 and A2-A2 of FIG. 1 and FIG. 3 is a cross-sectional view taken along lines B1-B1 and B2-B2 of FIG. 1.

Referring first to FIGS. 1 to 3, the semiconductor device 1 includes a substrate 100, an isolation layer 130, a first fin F1, a second fin F2, a first gate structure TR1, a second gate structure TR2, a first source/drain 210, a second source/drain 410, first dual liners 121 and 124, and second dual liners 321 and 324. A source/drain may serve as a source or a drain of a transistor.

The substrate 100 may be a silicon (Si) substrate, a silicon on insulator (SOI) substrate, a gallium arsenic substrate, a silicon germanium substrate, a ceramic substrate, a quartz substrate, a rigid substrate such as a glass substrate for display, or a flexible plastic substrate made of polyimide, polyester, polycarbonate, polyether sulfone, polymethyl methacrylate, polyethylene naphthalate, polyethylene terephthalate, or the like.

The substrate 100 may include a first region I and a second region II. The first region I and the second region II may be separated by an isolation layer 130. In an exemplary embodiment, the isolation layer 130 may be formed of a shallow trench isolation (STI). Here, the first region I may be an n-type metal oxide semiconductor (NMOS) region and the second region II may be a p-type metal oxide semiconductor (PMOS) region, but aspects of the present inventive concept are not limited thereto. The following description will be made with regard to a semiconductor device including an NMOS region as the first region I and a PMOS region as the second region II.

The isolation layer 130 is formed on the substrate 100 to be used for device isolation. The isolation layer 130 may be formed to have a shallow trench isolation (STI) structure having an device isolating characteristic in a small occupation area. Such STI structure may be used for fabricating a highly-integrated semiconductor device, but aspects of the present inventive concept are not limited thereto. The isolation layer 130 may include, for example, at least one of silicon oxide, silicon nitride, silicon oxynitride, and a combination thereof.

The first fin F1 and the second fin F2 are formed on the substrate 100 to protrude from the substrate 100. The first fin F1 is formed on the first region I and the second fin F2 is formed on the second region II. The first fin F1 and the second fin F2 may extend in the same direction. For example, the first fin F1 and the second fin F2 may extend lengthwise in a Y-axis direction, but aspects of the present inventive concept are not limited thereto. In an exemplary embodiment, the first fin F1 and the second fin F2 may extend in different directions. The first fin F1 and the second fin F2 may be portions of the substrate 101. The isolation layer 130 may be disposed on a top surface of the substrate 100 and on portions of lateral surfaces of the first fin F1 and second fin F2. In an exemplary embodiment, the isolation layer 130 may be disposed on lower portions in lateral surfaces of the first fin F1 and second fin F2.

The first gate structure TR1 is formed on the first fin F1 to intersect the first fin F1. For example, the first gate structure TR1 may extend lengthwise in an X-axis direction. The second gate structure TR2 is formed on the second fin F2 to intersect the second fin F2. For example, the second gate structure TR2 may extend lengthwise in the X-axis direction. The first gate structure TR1 and the second gate structure TR2 may extend in the same direction, but aspects of the present inventive concept are not limited thereto.

Each of the first gate structure TR1 and the second gate structure TR2 may include a gate insulation layer 151, a gate electrode 155 and a spacer 160 sequentially formed on the first fin F1 and the second fin F2. With this configuration, a channel may be formed on opposite lateral surfaces and top surfaces of the first fin F1 and the second fin F2.

Although not specifically shown, an interface layer may be formed between the isolation layer 130 and the first and second fins F1 and F2. The interface layer may prevent an interface failure between the isolation layer 130 and the gate insulation layer 151. The interface layer may include a low-k material layer having a dielectric constant (k) of 9 or less, for example, a silicon oxide layer (k≈4) or a silicon oxynitride layer (k≈4~8 according to the concentration of oxygen and nitrogen atoms). Alternatively, the interface layer may include silicate or a combination of layers listed above.

The gate insulation layer 151 may be formed on the isolation layer 130 and the first and second fins F1 and F2. The gate insulation layer 151 may include a high-k dielectric material. For example, the gate insulation layer 151 may include, for example, HfSiON, $HfO_2$, $ZrO_2$, $Ta_2O_5$, $TiO_2$, $SrTiO_3$, $SrTiO_3$ or $BaTiO_3$. The gate insulation layer 151 may be formed to an appropriate thickness according to the type of device to be formed. For example, when the gate insulation layer 151 includes $HfO_2$, the gate insulation layer 151 may be formed to have a thickness of about 50 Å or less (in a range of about 5 Å to about 50 Å), but aspects of the present inventive concept are not limited thereto. The gate insulation layer 151 may upwardly extend along sidewalls of a gate spacer 160 to be described later.

The gate electrode 155 may include a conductive material. For example, the gate electrode 155 may include first and second metal layers MG1 and MG2. The gate electrode 155 may include two or more metal layers MG1 and MG2 stacked one on another. The first metal layer MG1 controls a work function and the second metal layer MG2 may fill a space formed by the first metal layer MG1. The first metal layer MG1 may include, for example, at least one of TiN, TaN, TiC and TaC. The second metal layer MG2 may include, for example, at least one of W and Al. Alternatively, the gate electrode 155 may be made of a non-metal material, such as Si or SiGe. The gate electrode 155 may be formed by, for example, a replacement process (or a gate last process), but aspects of the present inventive concept are not limited thereto. For the convenience of description, it is assumed that the first and second gate structures TR1 and TR2 of FIG. 1 may be formed by a gate last forming process.

The spacer 160 may be disposed on at least one side of the gate electrode 155. For example, as shown in FIG. 2, the spacer 160 may be disposed on at opposite sides of the gate electrode 155. The spacer 160 may include at least one of a nitride layer and an oxynitride layer. In FIG. 2, the spacer 160 having one curved lateral surface is illustrated, but aspects of the present inventive concept are not limited thereto. However, the shape of the spacer 160 may be modified in various manners. For example, the spacer 160 may have an I-letter or L-letter shape.

Referring to FIG. 2, the first source/drain 210 may be formed on at least one side of the first gate structure TR1. The first source/drain 210 need not be in contact with the first dual liners 121 and 124, but aspects of the present inventive concept are not limited thereto. Likewise, the second source/drain 410 may be formed on at least one side of the second gate structure TR2. The second source/drain 410 need not be in contact with the second dual liners 321 and 324, but aspects of the present inventive concept are not limited thereto. The second source/drain 410 may be formed to be in contact with top surfaces of the second dual liners 321 and 324.

The first and second source/drains 210 and 410 may be formed by epitaxial growth. For example, the first and second sources or drains 210 and 410 may include may include, for example, a silicon element semiconductor, such as silicon or germanium. For example, the first and second source/drains 210 and 410 may include a compound semiconductor, for example, a group IV-IV compound semiconductor or a group III-V compound semiconductor. For example, the first and second sources or drains 210 and 410 may include a group IV-IV compound semiconductor, such as a binary compound or a ternary compound including at least two elements of carbon (C), silicon (Si), germanium (Ge), and tin (Sn) or a compound doped with a IV group element. The first and second sources or drains 210 and 410 may include, for example, a group III-V compound semiconductor, such as a binary compound, a ternary compound or a quaternary compound, prepared by combining at least one group III element of aluminum (Al), gallium (Ga) and indium (In) with at least one group V element of phosphorus (P), arsenic (As) and antimony (Sb). Although not specifically shown, the first and second source/drains 210 and 410 may have a lightly doped drain (LDD) structure, but aspects of the present inventive concept are not limited thereto.

For example, when the first region I is an NMOS region, the first source/drain 210 may apply tensile stress to a channel region of the first region I. Likewise, when the second region II is a PMOS, the second source/drain 410 may apply compressive stress to a channel region of the second region II. Accordingly, the performance of the semiconductor device may be increased.

Referring to FIG. 3, a first width D11 of the first fin F1 may be different from a second width D12 of the second fin F2. For example, the first width D11 of the first fin F1 may be greater than the second width D12 of the second fin F2. A width of a top portion of the second fin F2 may be equal to that of a bottom portion thereof. For example, the second fin F2 may be formed to have a constant width. The constant width of the second fin F2 may serve to prevent a fin critical dimension (FIN CD) between a transistor of the first region I and a transistor of the second region II from being changed as an epitaxial layer 340 is formed on the second fin F2 in a subsequent process.

For example, the first width D11 of the first fin F1 may be greater than the second width D12 of the second fin F2 at the first height from the top surface of the substrate 100. Here, a first height may be greater than a length from the top surface of the substrate 100 to the top surface of the first dual liner 121 and 124. The first height may be a position above the top surface of the first dual liner 121 and 124. For example, the first height may correspond to a top portion of each of the first fin F1 and the second fin F2. In an exemplary embodiment, the top surface of the first dual liner 121 and 124 may correspond to the topmost end of the first dual liner 121 and 124. In addition, the first width D11 of the first fin F1 may be greater than the second width D12 of the second fin F2 at a second height from the top surface of the substrate. Here, the second height may be smaller than a length from the top surface of the substrate 100 to the topmost end of the first dual liner 121, 124. The second height may be a position below the top surface of the first dual liner 121 and 124. For example, the second height may correspond to a bottom portion of each of the first fin F1 and the second fin F2 and is smaller than the first height.

The epitaxial layer 340 may be formed on the second fin F2. The epitaxial layer 340 may be formed to surround the top portion of the second fin F2. The epitaxial layer 340 may be formed along a profile of a protruding part of the second fin F2. For example, the epitaxial layer 340 may be formed to have a constant thickness (e.g., a third thickness W13) along the protruding part of the second fin F2, but aspects of the present inventive concept are not limited thereto. For example, the epitaxial layer 340 may have a thicker thickness at a corner of the second fin F2. For example, the epitaxial layer 340 may have a thicker thickness on a top surface of the second fin F2.

The epitaxial layer 340 may include SiGe. For example, the epitaxial layer 340 may be formed by one of solid phase epitaxy (SPE), liquid phase epitaxy (LPE) and vapor phase epitaxy (VPE). For example, the single crystalline epitaxial layer 340 is grown at a temperature in a range of about 500° C. to about 800° C. using a source gas including silicon (Si) and germanium (Ge). As the result, the single crystalline epitaxial layer 340 including Si—Ge is formed on the second fin F2. Thereafter, to stabilize the grown Si—Ge single crystalline epitaxial layer 340, a predetermined heat treatment process may further be performed, but aspects of the present inventive concept are not limited thereto. The epitaxial process may be performed only on the second region II but need not be performed on the first region I.

A total thickness (i.e., the third width D13) of the second fin F2 and the epitaxial layer 340 may be equal to or smaller than the width D11 of the first fin F1 at the first height from the top surface of the substrate 100, but aspects of the present inventive concept are not limited thereto.

The epitaxial layer 340 may be formed to be in contact with the third liner 321. In addition, the epitaxial layer 340 may be in contact with the fourth liner 324, but aspects of the present inventive concept are not limited thereto. The second gate structure TR2 may be formed on the epitaxial layer 340. For example, a gate insulation layer 151 and a gate electrode 155 disposed on the gate insulation layer 151 may be formed on the epitaxial layer 340. The epitaxial layer 340 may be in contact with the second gate structure TR2, overlapping the second gate structure TR2.

The epitaxial layer 340 may increase operating characteristics of the transistor positioned on the second region II.

The first dual liners 121 and 124 may be formed on the first region I. The first dual liners 121 and 124 may include a first liner 121 and a second liner 124. The first dual liners 121 and 124 may be in contact with the bottom portion of the first fin F1 without being in contact with the top portion of the first fin F1.

The first liner 121 may be formed on a lateral surface of the first fin F1. For example, the first liner 121 may be conformally formed on the top surface of the substrate 100 and the lateral surface of the first fin F1. The first liner 121 may be formed to have a first thickness W11. The first liner 121 may include silicon oxide formed by an oxidation process. The first liner 121 formed to the first thickness W11 may increase performance of the transistor formed on the first region I, but aspects of the present inventive concept are not limited thereto.

The second liner 124 may be formed on the first liner 121. The second liner 124 may be formed on the lateral surface of the first fin F1. The second liner 124 may be in contact with a portion of the first liner 121. The second liner 124 may include silicon nitride, but aspects of the present inventive concept are not limited thereto.

In addition, the second liner 124 may be formed by an etch-back process. For example, the second liner 124 may be formed only on the lateral surface of the first fin F1 without completely filling a space between neighboring first fins F1, but aspects of the present inventive concept are not limited thereto.

The second dual liners 321 and 324 may be formed on the second region II. The second dual liners 121 and 124 may include a third liner 321 and a fourth liner 324. The second dual liners 321 and 324 may be in contact with the bottom portion of the second fin F2 without being in contact with the top portion of the second fin F2.

The third liner 321 may be formed on the lateral surface of the second fin F2. For example, the third liner 321 may be conformally formed on the top surface of the substrate 100 and the lateral surface of the second fin F2. The third liner 321 may be formed to have a second thickness W12. The second thickness W12 may be different from the first thickness W11. For example, the second thickness W12 may be smaller than the first thickness W11, but aspects of the present inventive concept are not limited thereto. The third liner 321 may be formed by a chemical oxidation process. For example, the third liner 321 may be formed by an atomic layer deposition (ALD) process or an in Situ Steam Generation (ISSG) process. Accordingly, the third liner 321 may include silicon oxide. In addition, the third liner 321 may be formed to have a thickness of about 1 nm or less, but aspects of the present inventive concept are not limited thereto.

The fourth liner 324 may be formed on the third liner 321. The fourth liner 324 may be formed on the lateral surface of the second fin F2. The fourth liner 324 may be disposed to be in contact with a portion of the third liner 321. The fourth liner 324 may include silicon nitride. The fourth liner 324 and the second liner 124 may be formed by the same process. Accordingly, the fourth liner 324 and the second liner 124 may include the same material. In an exemplary embodiment, the fourth liner 324 and the second liner 124 may have the same thickness, but aspects of the present inventive concept are not limited thereto.

In addition, the fourth liner 324 may be formed by an etch-back process. For example, the fourth liner 324 may be formed only on the lateral surface of the second fin F2 without completely filling a space between neighboring second fins F2, but aspects of the present inventive concept are not limited thereto.

The isolation layer 130 may be formed on the first dual liners 121 and 124 and the second dual liners 321 and 324 to form STI. The isolation layer 130 may be formed on inner surfaces of the first dual liners 121 and 124 and the second dual liners 321 and 324. The isolation layer 130 may be in contact with sidewalls and bottom surfaces of the first dual liners 121 and 124 and the second dual liners 321 and 324. A top surface of the isolation layer 130 may be positioned to be coplanar with top surfaces of the first dual liners 121 and 124 and the second dual liners 321 and 324, but aspects of the present inventive concept are not limited thereto.

In addition, the isolation layer 130 may be in contact with portions of the first liner 121 and the third liner 321.

Figure 4:
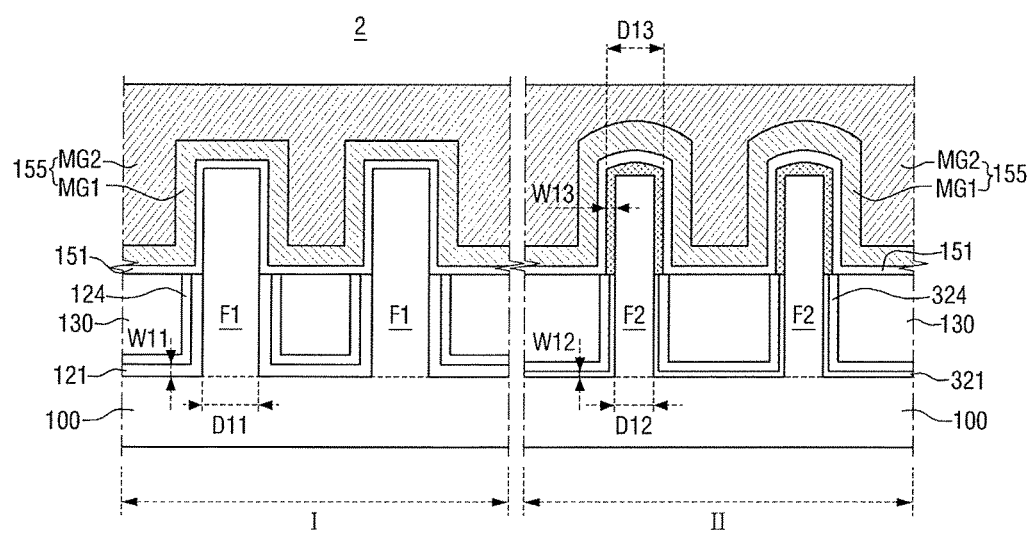
FIG. 4 is a perspective view of a semiconductor device according to an exemplary embodiment of the present inventive concept.

FIG. 4 is a perspective view of a semiconductor device according to an exemplary embodiment of the present inventive concept. For the sake of convenient explanation, the same content as that of the previous embodiment will not be repeatedly described and the following description will focus on differences between the present and previous embodiments.

Referring to FIG. 4, the semiconductor device 2 may be manufactured in substantially the same manner as the semiconductor device 1 of FIG. 3.

However, a second liner 124 of a first region I in the semiconductor device 2 may be conformally formed on a first liner 121. For example, the second liner 124 may be formed on the first liner 121 by a deposition process to have a constant thickness. Therefore, the second liner 124 may be continuously formed between each of a plurality of first fins F1. An isolation layer 130 need not be in contact with the first liner 121. For example, the second liner 124 may be interposed between the first liner 121 and the isolation layer 130.

In addition, a fourth liner 324 of a second region II may be conformally formed on a third liner 321. For example, the fourth liner 324 may also be formed on the third liner 321 by a deposition process to have a constant thickness. Therefore, the fourth liner 324 may be continuously formed between each of a plurality of second fins F2 and the isolation layer 130. The isolation layer 130 need not be brought into contact with the third liner 321. For example, the fourth liner 324 may be interposed between the third liner 321 and the isolation layer 130. Here, the fourth liner 324 and the second liner 124 may be formed at the same time by the same deposition process and may be formed to have the same thickness.

Figure 5:
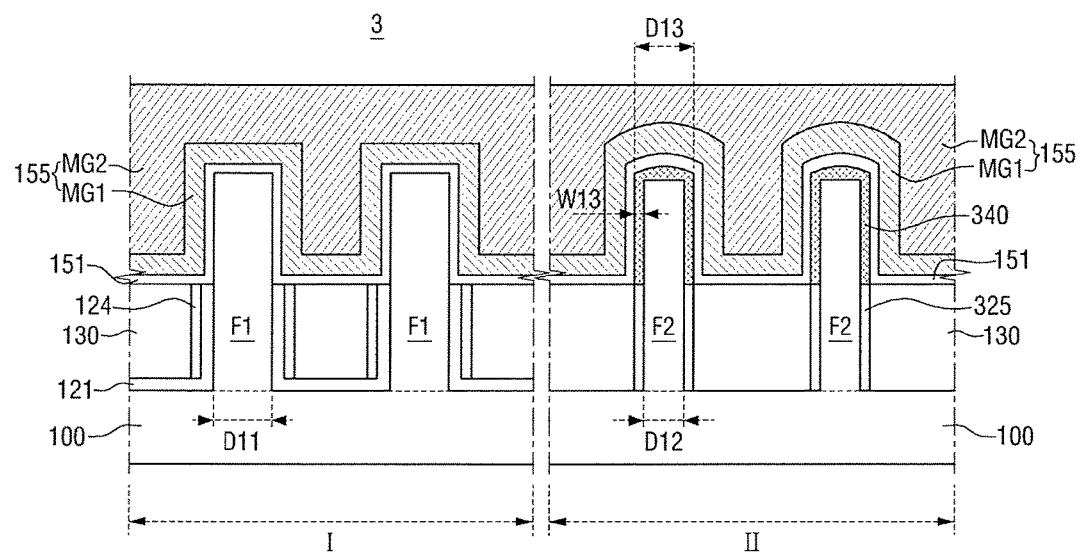
FIG. 5 is a perspective view of a semiconductor device according to an exemplary embodiment of the present inventive concept.

FIG. 5 is a perspective view of a semiconductor device according to an exemplary embodiment of the present inventive concept. For the sake of convenient explanation, the same content as that of the previous embodiment will not be repeatedly described and the following description will focus on differences between the present and previous embodiments.

Referring to FIG. 5, the semiconductor device 3 may be manufactured in substantially the same manner as the semiconductor device 1 of FIG. 3.

In the semiconductor device 3, first dual liners 121 and 124 are formed on a first region I, and only a fourth liner 325 as a single liner is formed on the second region II.

The fourth liner 325 may be formed to be in contact with sidewalls of a second fin F2 and need not be formed on a substrate 100 between each of a plurality of second fins F2, but aspects of the present inventive concept are not limited thereto. The fourth liner 325 may be formed very thinly on the substrate 100 between each of the plurality of second fins F2.

The fourth liner 325 and the second liner 124 may be formed at the same time by the same etch-back process and may be formed to have the same thickness.

Figure 6:
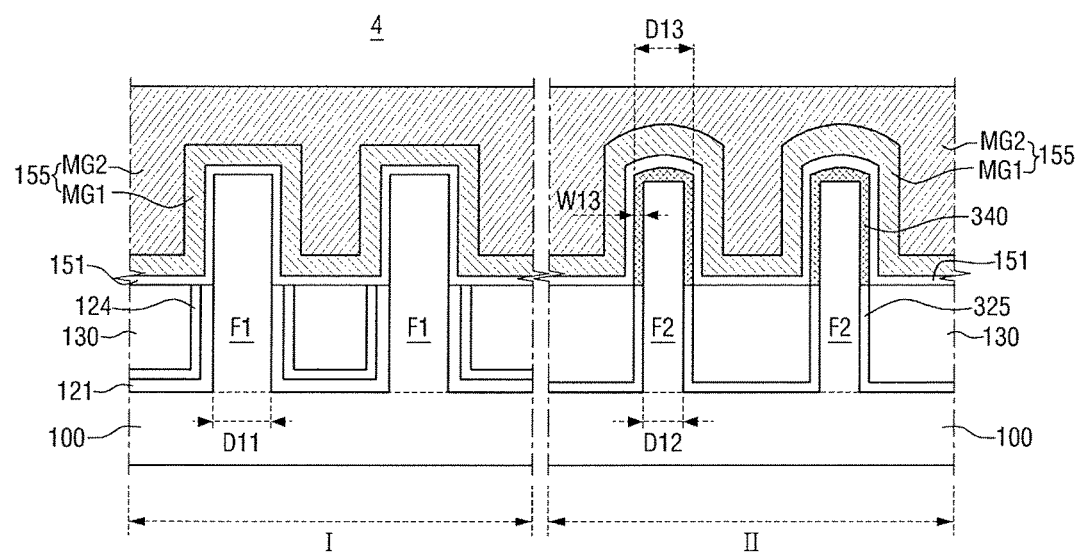
FIG. 6 is a perspective view of a semiconductor device according to an exemplary embodiment of the present inventive concept.

FIG. 6 is a perspective view of a semiconductor device according to an exemplary embodiment of the present inventive concept. For the sake of convenient explanation, the same content as that of the previous embodiment will not be repeatedly described and the following description will focus on differences between the present and previous embodiments.

Referring to FIG. 6, the semiconductor device 4 may be manufactured in substantially the same manner as the semiconductor device 3 of FIG. 5.

A second liner 124 of a first region I in the semiconductor device 4 may be conformally formed on a first liner 121. For example, the second liner 124 may be formed on the first liner 121 by a deposition process to have a constant thickness. Therefore, the second liner 124 may be continuously formed between each of a plurality of first fins F1. An isolation layer 130 need not be in contact with the first liner 121. For example, the second liner 124 may be interposed between the first liner 121 and the isolation layer 130.

In addition, a fourth liner 325 of a second region II may be conformally formed on sidewalls of the second fin F2 and on the substrate 100. For example, the fourth liner 325 may be continuously formed on the substrate 100 and the sidewalls of the second fin F2 by a deposition process to have a constant thickness. Therefore, the fourth liner 325 may be continuously formed on a region between each of a plurality of second fins F2. An isolation layer 130 need not be in contact with the substrate 100. Here, the fourth liner 325 and the second liner 124 may be formed at the same time by the same deposition process and may be formed to have the same thickness, but aspects of the present inventive concept are not limited thereto.

Figure 7:
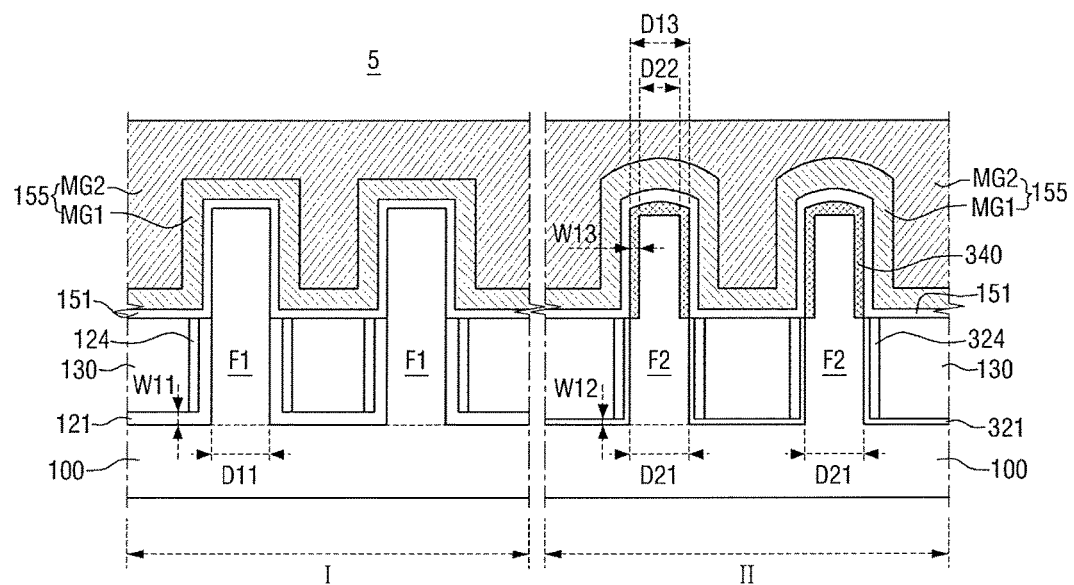
FIG. 7 is a perspective view of a semiconductor device according to an exemplary embodiment of the present inventive concept.

FIG. 7 is a perspective view of a semiconductor device according to an exemplary embodiment of the present inventive concept. For the sake of convenient explanation, the same content as that of the previous embodiment will not be repeatedly described and the following description will focus on differences between the present and previous embodiments.

Referring to FIG. 7, the semiconductor device 5 may be manufactured in substantially the same manner as the semiconductor device 1 of FIG. 3.

However, in a case of a second fin F2 of a second region II, a second width D21 of a bottom portion of the second fin F2 may be equal to a first width D11 of a first fin F1 of a first region I. A third width D22 of a top portion of the second fin F2 may be smaller than the first width D11 of the first fin F1 of the first region I to prevent a fin critical dimension (FIN CD) between a transistor of the first region I and a transistor of the second region II from being changed as an epitaxial layer 340 is formed on the second fin F2 in a subsequent process.

For example, the first width D11 of the first fin F1 may be greater than the third width D22 of the second fin F2 at a first height from a top surface of a substrate 100. Here, the first height may be greater than a length from the top surface of the substrate 100 to the top surface of a first dual liner 121 and 124. In an exemplary embodiment, the top surface of the first dual liner 121 and 124 and the top surface of the second dual liner 321 and 324 may be positioned at substantially the same height. For example, the first height may correspond to a top portion of each of the first fin F1 and the second fin F2.

In addition, the first width D11 of the first fin F1 may be greater than the second width D21 of the second fin F2 at a second height from the top surface of the substrate 100. Here, the second height may be smaller than a length from the top surface of the substrate 100 to the topmost end of the first dual liner 121 and 124. For example, the second height may correspond to a bottom portion of each of the first fin F1 and the second fin F2 and may be smaller than the first height.

A total thickness (i.e., the fourth width D13) of the second fin F2 and the epitaxial layer 340 may be equal to or smaller than the second width D21 of the bottom portion of the second fin F2 at the first height from the top surface of the substrate 100. Accordingly, the epitaxial layer 340 need not be in contact with the third liner 321 and the fourth liner 324, but aspects of the present inventive concept are not limited thereto. For example, the epitaxial layer 340 may be in contact with the third liner 321 without being in contact with the fourth liner 324.

The first dual liners 121 and 124 and the second dual liners 321 and 324 of the semiconductor device 5 may be substantially the same as the first dual liners 121 and 124 and the second dual liners 321 and 324 of the semiconductor devices 1 and 2.

Figure 8:
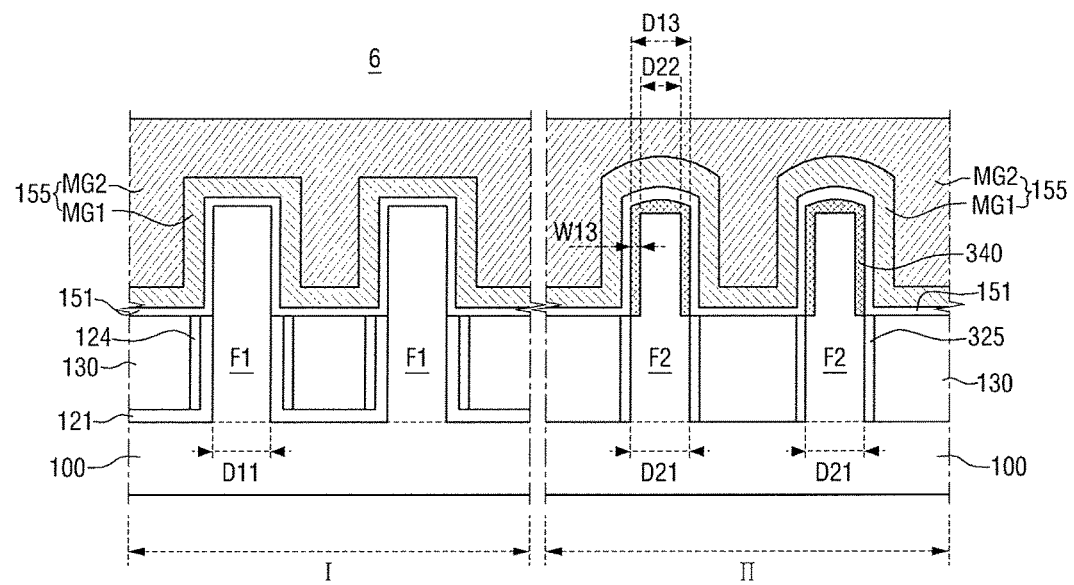
FIG. 8 is a perspective view of a semiconductor device according to an exemplary embodiment of the present inventive concept.

FIG. 8 is a perspective view of a semiconductor device according to an exemplary embodiment of the present inventive concept. For the sake of convenient explanation, the same content as that of the previous embodiment will not be repeatedly described and the following description will focus on differences between the present and previous embodiments.

Referring to FIG. 8, the semiconductor device 6 may be manufactured in substantially the same manner as the semiconductor device 5 of FIG. 7.

In the semiconductor device 6, first dual liners 121 and 124 are formed on a first region I, and only a fourth liner 325 as a single liner is formed on the second region II.

The fourth liner 325 may be formed to be in contact with sidewalls of a second fin F2 but need not be formed on a substrate 100 between each of a plurality of second fins F2, but aspects of the present inventive concept are not limited thereto. For example, the fourth liner 325 may be formed very thinly on the substrate 100 between each of the plurality of second fins F2.

The fourth liner 325 and the second liner 124 may be formed at the same time by the same etch-back process and may be formed to have the same thickness.

The first dual liners 121 and 124 and the second dual liners 325 of the semiconductor device 6 may be substantially the same as the first dual liners 121 and 124 and the second dual liners 325 of the semiconductor devices 3 and 4.

Figure 9:
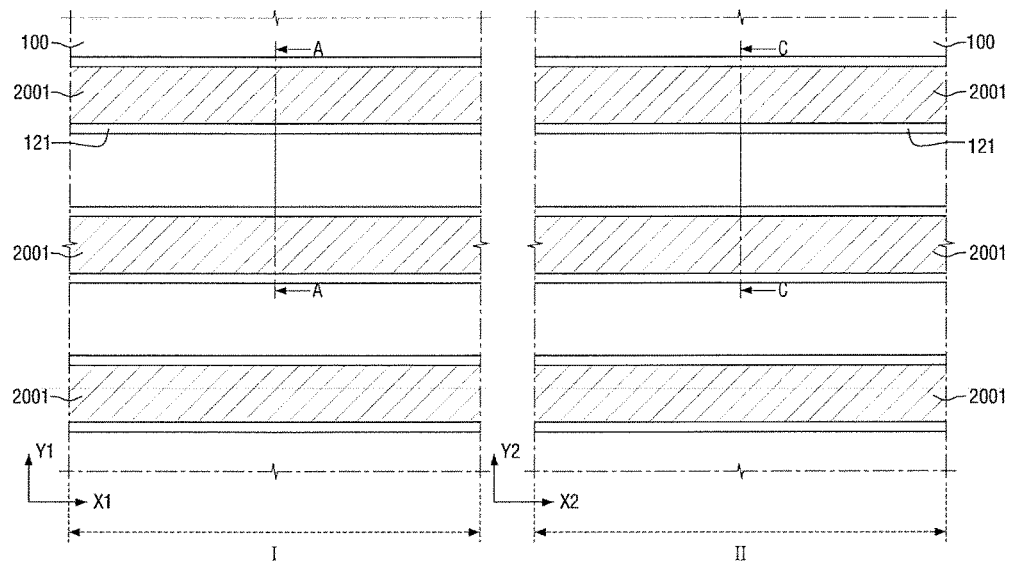
FIGS. 9 to 20 are views illustrating intermediate process steps for describing a method for fabricating a semiconductor device according to an exemplary embodiment of the present inventive concept.
Figure 10:
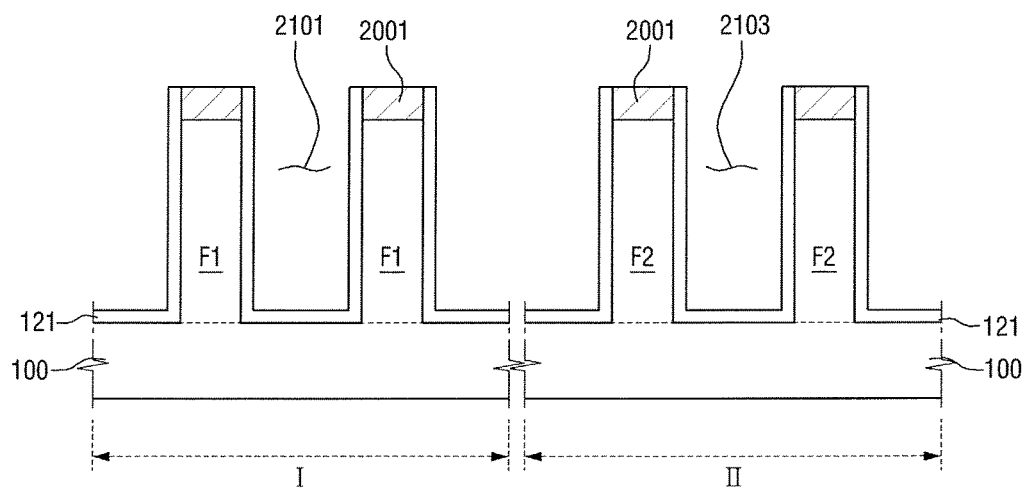

FIGS. 9 to 20 are views illustrating intermediate process steps for describing a method for fabricating a semiconductor device according to an exemplary embodiment of the present inventive concept. FIG. 10 is a cross-sectional view taken along lines A-A and C-C of FIG. 9.

Referring to FIG. 9, a first mask pattern 2001 may be formed on a substrate 100. The first mask pattern 2001 may extend on a first region I in a first direction X1 and may extend on a second region II in a third direction X2.

The substrate 100 may include a first region I and a second region II. The first region I and the second region II may be separated from each other or may be connected to each other.

The first mask pattern 2001 may include, for example, silicon oxide, silicon nitride, silicon oxynitride, a metal layer, a photo resist, a spin on glass (SOG) mask and/or a spin on hard mask (SOH), but aspects of the present inventive concept are not limited thereto.

Referring to FIG. 10, the substrate 100 that is not covered by the first mask pattern 2001 may be etched to form a first trench 2101 and a second trench 2103 in the substrate 100. The first trench 2101 may be formed in the first region I and the second trench 2103 may be formed in the second region II.

As the result of etching a portion of the substrate 100, a first fin F1 may be formed on the first region I of the substrate 100 and a second fin F2 may be formed on the second region II of the substrate 100.

Since the first mask pattern 2001 is used as an etch mask, the first fin F1 may extend in the first direction X1 and the second fin F2 may extend in the third direction X2. The first direction X1 and the third direction X2 may be parallel to each other, but aspects of the present inventive concept are not limited thereto.

The first mask pattern 2001 may remain on the first fin F1 and the second fin F2.

Next, a first liner 121 may be formed on the first region I and the second region II. For example, the first liner 121 may be conformally formed on lateral surfaces of the first fin F1, lateral surfaces of the second fin F2 and on a top surface of the substrate 100. Although not specifically shown, the first liner 121 may also be formed on the first mask pattern 2001. The first liner 121 may be formed by an oxidation process or a deposition process, and may include silicon oxide.

Figure 11:
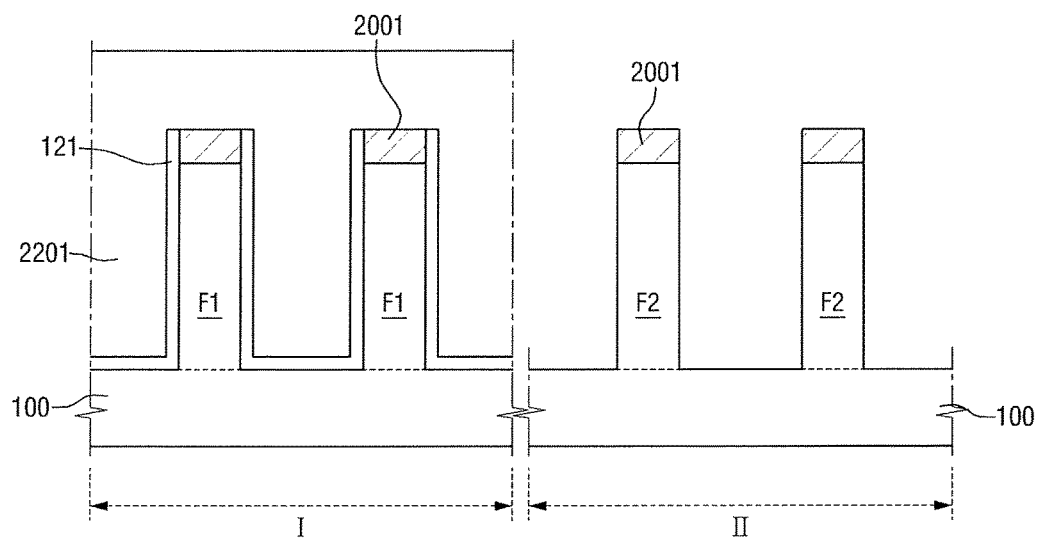

Next, referring to FIG. 11, a first mask pattern 2201 covering only the first region I may be formed. Next, the first liner 121 formed on the second region II may be removed by an etching process. Here, the first liner 121 may be removed by dry etching or wet etching.

Figure 12:
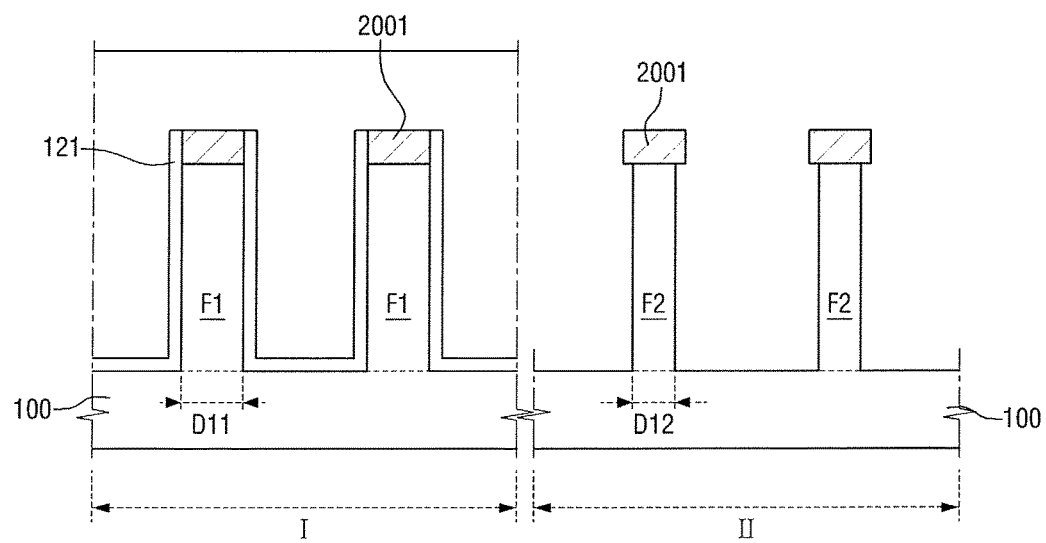

Next, referring to FIG. 12, the second fin F2 may be trimmed by an etching process. As the result, a width of the second fin F2 may be reduced. A second width D12 of the second fin F2 may be smaller than a first width D11 of the first fin F1. Although not specifically shown, in the trimming of the second fin F2, a height of a top surface of the substrate 100 of the second region II may become smaller than that of the top surface of the substrate 100 of the first region I.

The second fin F2 is trimmed to prevent a fin critical dimension (FIN CD) between a transistor of the first region I and a transistor of the second region II from being changed as an epitaxial layer 340 is formed on the second fin F2 in a subsequent process.

Figure 13:
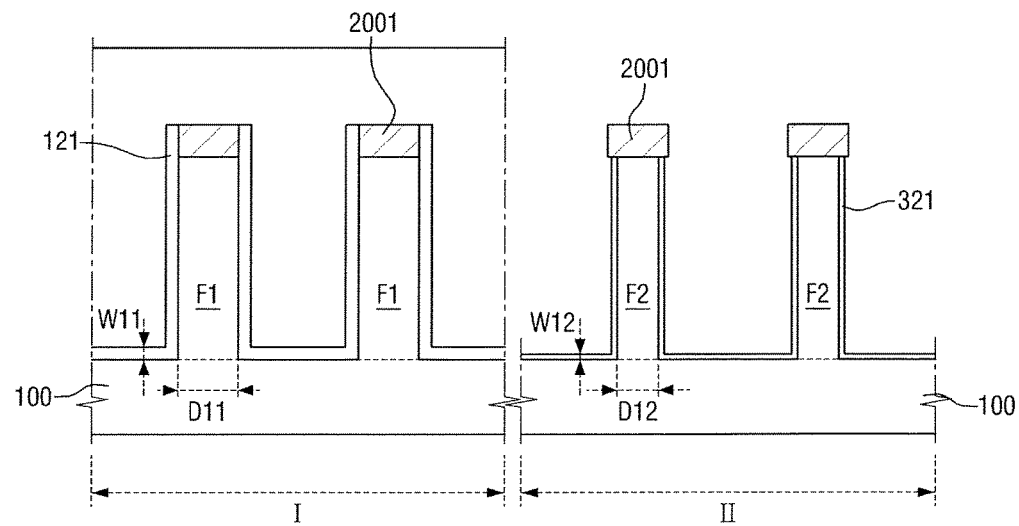

Next, referring to FIG. 13, a third liner 321 may be formed only on the second region II by an oxidation process. The third liner 321 may be conformally formed on the lateral surfaces of the second fin F2 and on the top surface of the substrate 100, but aspects of the present inventive concept are not limited thereto. Here, the third liner 321 may be formed by, for example, a chemical oxidation process, a UV oxidation process, a dual plasma oxidation process, a thermal oxidation process, a chemical vapor deposition process or an atomic layer deposition process, but aspects of the present inventive concept are not limited thereto.

The third liner 321 may be formed to be thinner than the first liner 121. For example, the third liner 321 may be formed to have a second thickness W12. The second thickness W12 may be different from a first thickness W11 of the first liner 121. For example, the second thickness W12 may be smaller than the first thickness W11, but aspects of the present inventive concept are not limited thereto.

The third liner 321 and the first liner 121 may include the same material, but aspects of the present inventive concept are not limited thereto.

Figure 14:
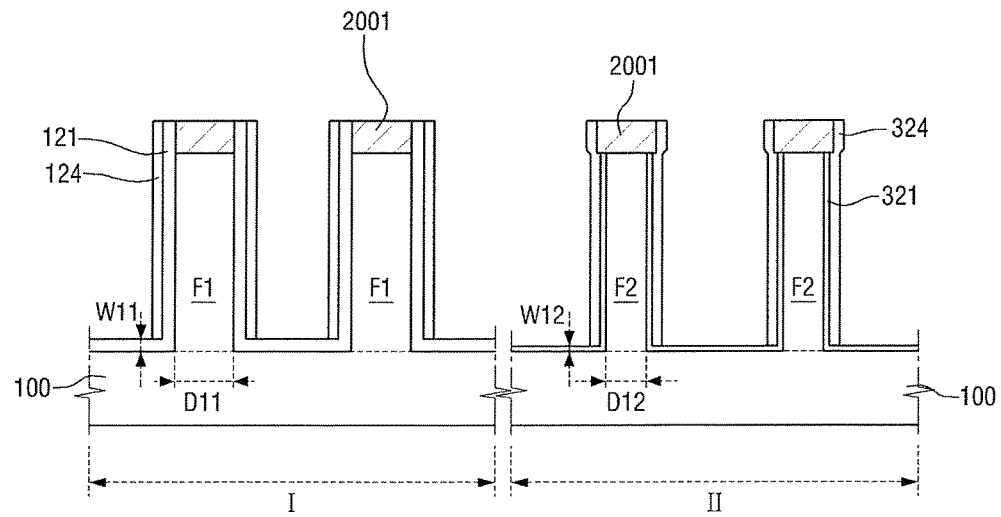

Next, referring to FIG. 14, a second liner 124 and a fourth liner 324 may be formed on the first region I and the second region II, respectively.

The second liner 124 may be formed on the first liner 121. The second liner 124 may be formed on the lateral surfaces of the first fin F1. The second liner 124 may be disposed to be in contact with a portion of the first liner 121. The second liner 124 may include silicon nitride, but aspects of the present inventive concept are not limited thereto.

The fourth liner 324 may be formed on the third liner 321. The fourth liner 324 may be formed on the lateral surfaces of the second fin F2. The fourth liner 324 may be disposed to be in contact with a portion of the third liner 321. The fourth liner 324 may include silicon nitride. The fourth liner 324 and the second liner 124 may be formed by the same process. Accordingly, the fourth liner 324 and the second liner 124 may include the same material. Although not specifically shown, the fourth liner 324 and the second liner 124 may have the same thickness, but aspects of the present inventive concept are not limited thereto.

In addition, the second liner 124 and the fourth liner 324 may be formed by an etch-back process. For example, the second liner 124 and the fourth liner 324 may be formed only on the lateral surfaces of the first fin F1 and the second fin F2, but aspects of the present inventive concept are not limited thereto. The second liner 124 and the fourth liner 324 may be conformally formed on the first liner 121 and the third liner 321.

Figure 15:
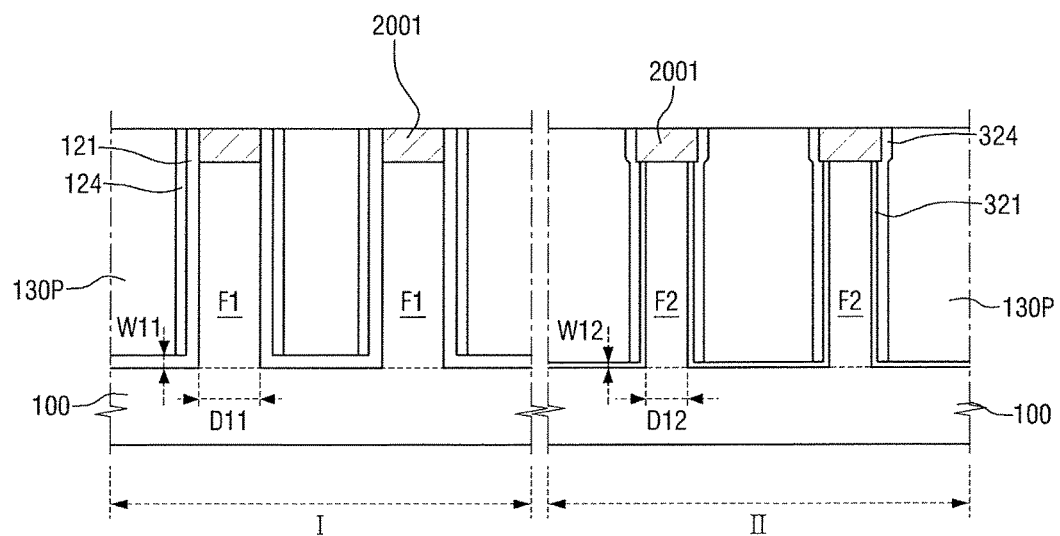

Next, referring to FIG. 15, a pre-isolation layer 130P may be formed on the first dual liners 121 and 124 and the second dual liners 321 and 324.

The pre-isolation layer 130P may include, for example, at least one of a silicon oxide layer, a silicon nitride layer, and a silicon oxynitride layer. The pre-isolation layer 130P may be formed by, for example, a physical vapor deposition process (PVD), a chemical vapor deposition process (CVD), an atomic layer deposition process (ALD) or a combination thereof.

Then, a planarization process may be performed so that top surfaces of the first dual liners 121 and 124 and the second dual liners 321 and 324 are positioned to be coplanar with a top surface of the pre-isolation layer 130P. As the result of the performing of the planarization process, the first mask pattern 2001 may be partially removed, but aspects of the present inventive concept are not limited thereto.

The first mask pattern 2001 may be removed prior to the forming of the pre-isolation layer 130P or after performing a recess process to later be described with reference to FIG. 16.

Figure 16:
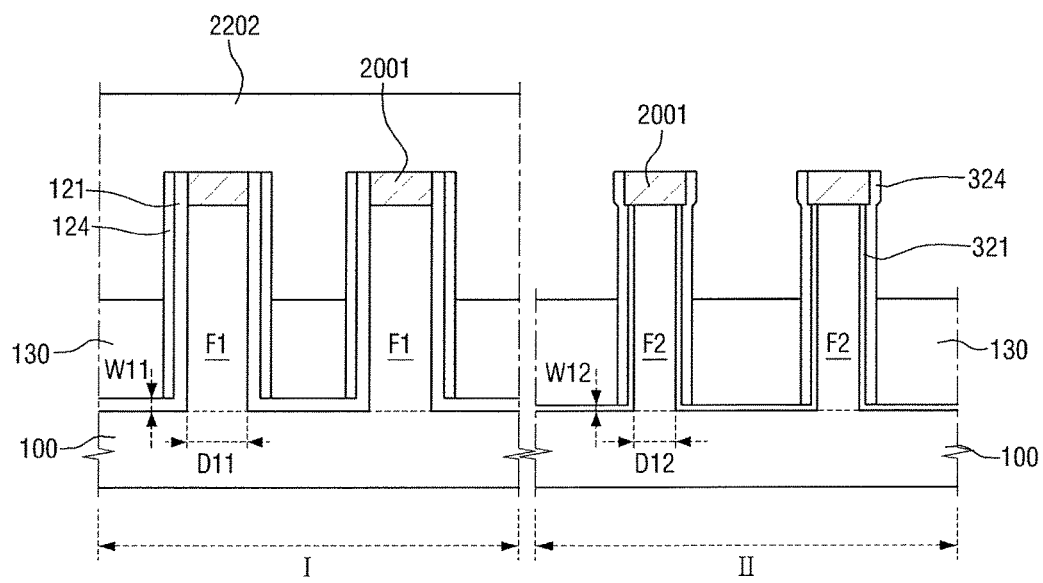

Next, referring to FIG. 16, a top portion of the pre-isolation layer 130P may be recessed to expose top portions of the first dual liners 121 and 124 and the second dual liners 321 and 324.

Then, a second mask pattern 2202 covering only the first region I may be formed.

Figure 17:
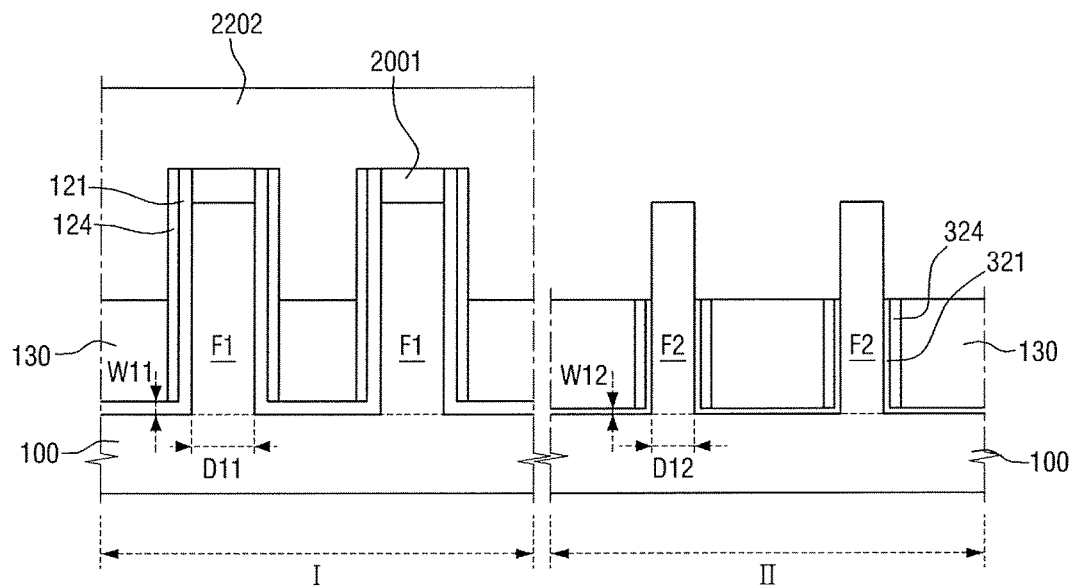

Next, referring to FIG. 17, the top portion of the second dual liners 321 and 324 may be recessed to expose a top portion of the second fin F2. As the result, a top surface of the isolation layer 130 may be coplanar with the top surfaces of the second dual liners 321 and 324, but aspects of the present inventive concept are not limited thereto.

Figure 18:
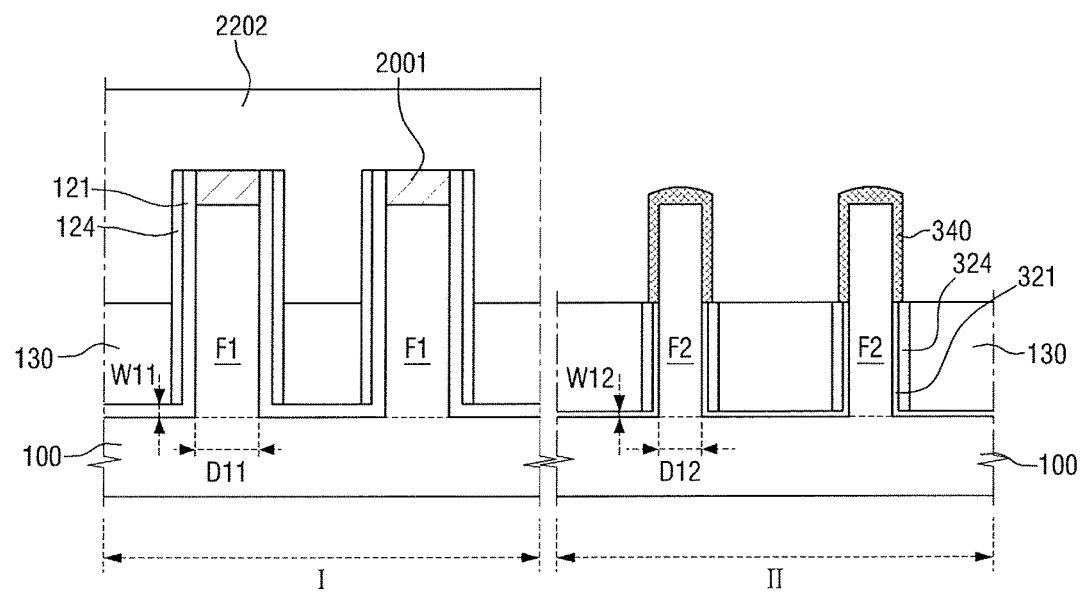

Next, referring to FIG. 18, an epitaxial layer 340 may be formed on the second fin F2. The epitaxial layer 340 may be formed to surround the top portion of the second fin F2. The epitaxial layer 340 may be formed along a profile of a protruding part of the second fin F2. For example, the epitaxial layer 340 may be formed to have a constant thickness along the protruding part of the second fin F2, but aspects of the present inventive concept are not limited thereto. For example, the epitaxial layer 340 may be thicker at a corner of the second fin F2. For example, the epitaxial layer 340 may be thicker at a top surface of the second fin F2.

In addition, the epitaxial layer 340 may include SiGe. For example, the epitaxial layer 340 may be formed by one of solid phase epitaxy (SPE), liquid phase epitaxy (LPE) and vapor phase epitaxy (VPE). The epitaxial layer 340 may be formed to be in contact with the third liner 321. In addition, the epitaxial layer 340 may be in contact with the fourth liner 324, but aspects of the present inventive concept are not limited thereto.

Figure 19:
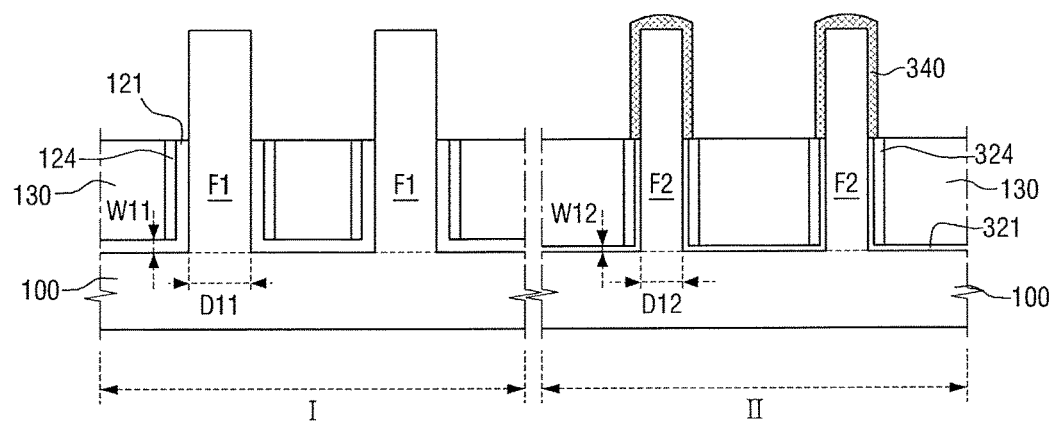

Next, referring to FIG. 19, the second mask pattern 2202 covering only the first region I, and the top portions of the first dual liners 121 and 124, may be removed to expose the top portion of the first fin F1. As the result, the top surface of the isolation layer 130 and the top surface of the first liner 121 may be coplanarly positioned, but aspects of the present inventive concept are not limited thereto.

Figure 20:
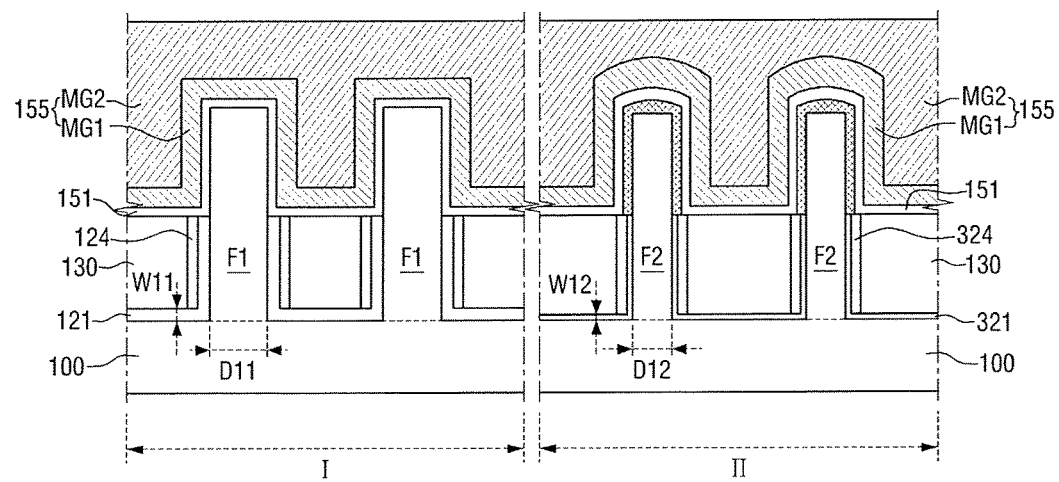

Next, referring to FIG. 20, a gate insulation layer 151 and a gate electrode 155 are formed on the first fin F1 and the second fin F2.

The gate insulation layer 151 may include, for example, a high-k dielectric material. For example, the gate insulation layer 151 may include $HfO_2$, $Al_2O_3$, $ZrO_2$, or $TaO_2$, but aspects of the present inventive concept are not limited thereto.

Although not specifically shown, an interface layer for preventing an interface failure between the gate insulation layer 151 and the first fin F1 or the second fin F2 may further be provided between the gate insulation layer 151 and the first fin F1 or the second fin F2. The interface layer may include a low-k dielectric material layer having a dielectric constant (k) of 9 or less, for example, a silicon oxide layer (k≈4) or a silicon oxynitride layer (k≈4~8 according to the concentration of oxygen and nitrogen atoms). Alternatively, the interface layer may include silicate or a combination of layers listed above.

The gate insulation layer 151 may be formed by, for example, a physical vapor deposition process (PVD), a chemical vapor deposition process (CVD), an atomic layer deposition process (ALD) or a combination thereof.

The gate electrode 155 may be formed on the gate insulation layer 151. The gate electrode 155 may include a conductive material. The gate electrode 155 may extend in a third direction Y1 intersecting the first fin F1 or in a fourth direction Y2 intersecting the second fin F2.

The gate electrode 155 may include metal layers MG1 and MG2. As shown, the gate electrode 155 may include two or more metal layers MG1 and MG2 stacked one on another. The first metal layer MG1 controls a work function and the second metal layer MG2 may fill a space formed by the first metal layer MG1. In an exemplary embodiment, the second metal layer MG2 may completely fill the space formed by the first metal layer MG1.

The first metal layer MG1 may include, for example, at least one of TiN, TaN, TiC and TaC, but aspects of the present inventive concept are not limited thereto. In addition, the second metal layer MG2 may include, for example, at least one of W, Al, Cu, Co, Ti, Ta, poly-Si, SiGe and a metal alloy, but aspects of the present inventive concept are not limited thereto.

Figure 21:
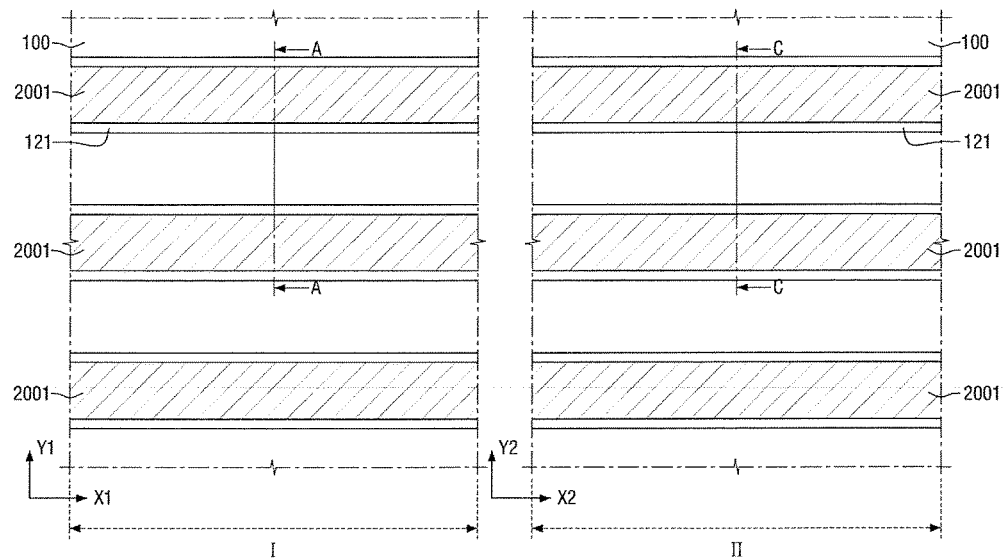
FIGS. 21 to 31 are views illustrating intermediate process steps for describing a method for fabricating a semiconductor device according to an exemplary embodiment of the present inventive concept.
Figure 22:
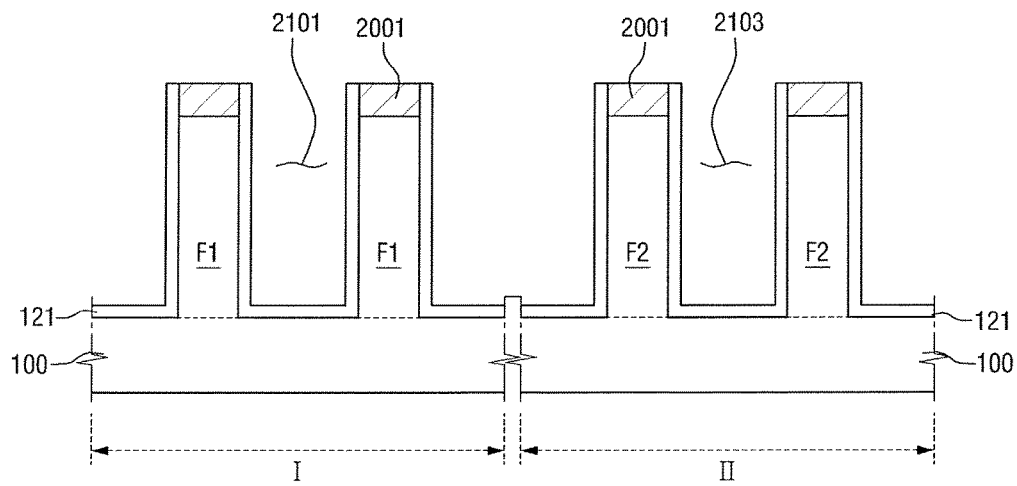

FIGS. 21 to 31 are views illustrating intermediate process steps for describing a method for fabricating a semiconductor device according to an exemplary embodiment of the present inventive concept. Specifically, FIG. 22 is a cross-sectional view taken along lines A-A and C-C of FIG. 21. For the sake of convenient explanation, the same content as that of the previous embodiment will not be repeatedly described and the following description will focus on differences between the present and previous embodiments.

Referring to FIG. 21, a first mask pattern 2001 may be formed on a substrate 100. The first mask pattern 2001 may extend on a first region I in a first direction X1 and may extend on a second region II in a third direction X2.

The substrate 100 may include the first region I and the second region II. The first region I and the second region II may be separated from each other or may be connected to each other.

Next, referring to FIG. 22, the substrate 100 that is not covered by the first mask pattern 2001 may be etched to form a first trench 2101 and a second trench 2103 in the substrate 100. The first trench 2101 may be formed in the first region I and the second trench 2103 may be formed in the second region II.

As the result of etching a portion of the substrate 100, a first fin F1 may be formed on the first region I of the substrate 100 and a second fin F2 may be formed on the second region II of the substrate 100.

Since the first mask pattern 2001 is used as an etch mask, the first fin F1 may extend in the first direction X1 and the second fin F2 may extend in the third direction X2. The first direction X1 and the third direction X2 may be in parallel to each other, but aspects of the present inventive concept are not limited thereto.

The first mask pattern 2001 may remain on the first fin F1 and the second fin F2.

Next, a first liner 121 may be formed on the first region I and the second region II. For example, the first liner 121 may be conformally formed on lateral surfaces of the first fin F1, lateral surfaces of the second fin F2 and on a top surface of the substrate 100. Although not specifically shown, the first liner 121 may also be formed on the first mask pattern 2001. The first liner 121 may be formed by an oxidation process or a deposition process, and may include silicon oxide.

Figure 23:
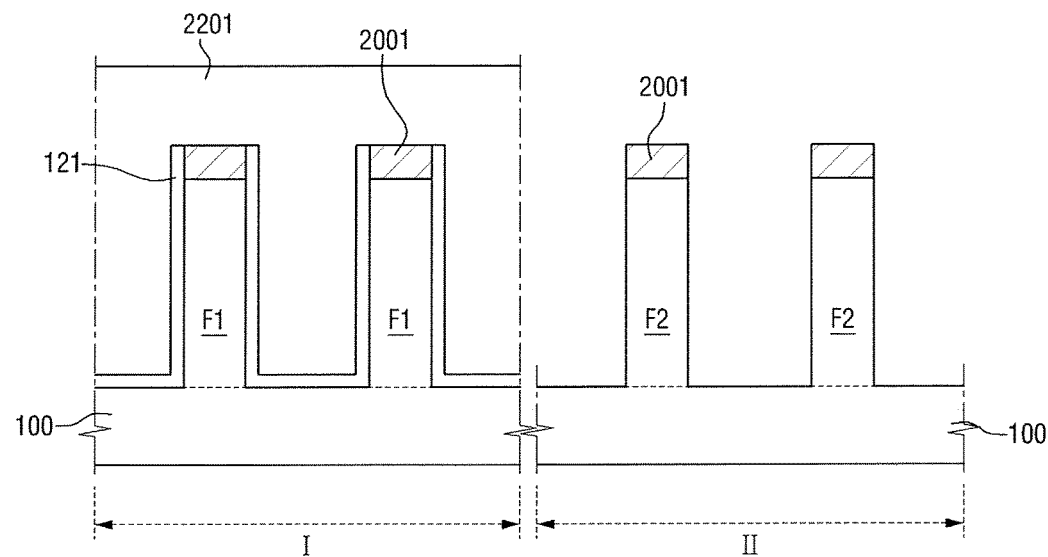

Next, referring to FIG. 23, a first mask pattern 2201 covering only the first region I may be formed. Next, the first liner 121 formed on the second region II may be removed by an etching process. Here, the first liner 121 may be removed by dry etching or wet etching.

Figure 24:
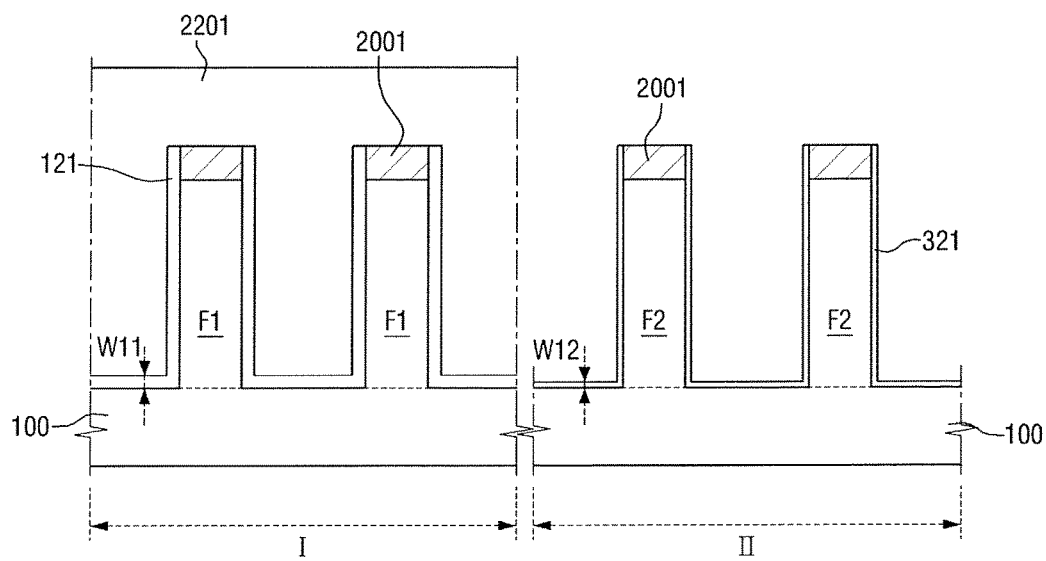

Next, referring to FIG. 24, a third liner 321 may be formed only on the second region II by an oxidation process. The third liner 321 may be conformally formed on the lateral surfaces of the second fin F2 and on the substrate 100, but aspects of the present inventive concept are not limited thereto. Here, the third liner 321 may be formed by, for example, a chemical oxidation process, a UV oxidation process, a dual plasma oxidation process, a thermal oxidation process, a chemical vapor deposition process or an atomic layer deposition process, but aspects of the present inventive concept are not limited thereto.

The third liner 321 may be formed to be thinner than the first liner 121. For example, the third liner 321 may be formed to have a second thickness W12. The second thickness W12 may be different from a first thickness W11 of the first liner 121. For example, the second thickness W12 may be smaller than the first thickness W11, but aspects of the present inventive concept are not limited thereto.

The third liner 321 and the first liner 121 may include the same material, but aspects of the present inventive concept are not limited thereto.

Figure 25:
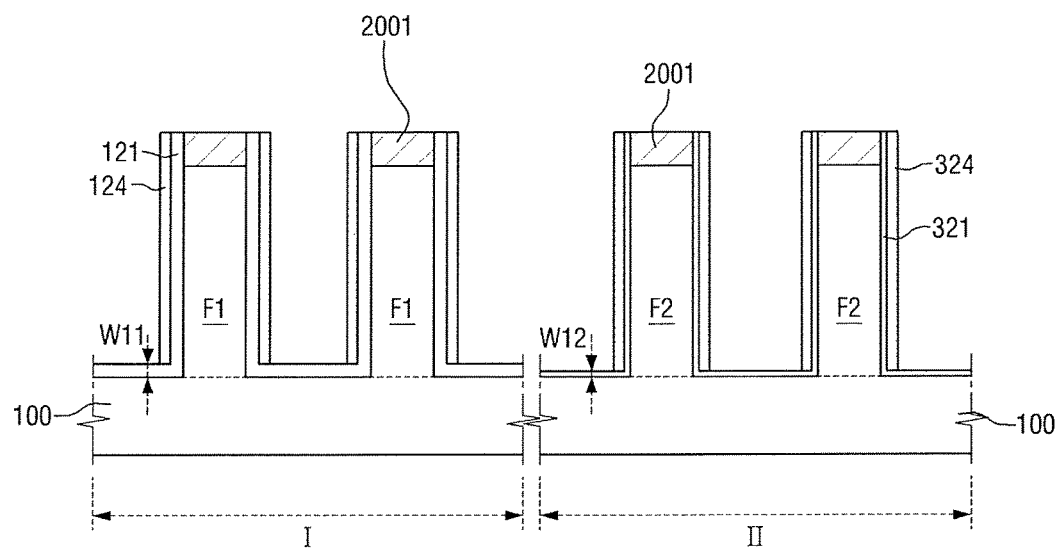

Next, referring to FIG. 25, a second liner 124 and a fourth liner 324 may be formed on the first region I and the second region II, respectively.

The second liner 124 may be formed on the first liner 121. The second liner 124 may be formed on the lateral surfaces of the first fin F1. The second liner 124 may be disposed to be in contact with a portion of the first liner 121. The second liner 124 may include silicon nitride, but aspects of the present inventive concept are not limited thereto.

The fourth liner 324 may be formed on the third liner 321. The fourth liner 324 may be formed on the lateral surfaces of the second fin F2. The fourth liner 324 may be disposed to be in contact with a portion of the third liner 321. The fourth liner 324 may include silicon nitride. The fourth liner 324 and the second liner 124 may be formed by the same process. Accordingly, the fourth liner 324 and the second liner 124 may include the same material. Although not specifically shown, the fourth liner 324 and the second liner 124 may have the same thickness, but aspects of the present inventive concept are not limited thereto.

In addition, the second liner 124 and the fourth liner 324 may be formed by an etch-back process. For example, the second liner 124 and the fourth liner 324 may be formed only on the lateral surfaces of the first fin F1 and the second fin F2, but aspects of the present inventive concept are not limited thereto. The second liner 124 and the fourth liner 324 may be conformally formed on the first liner 121 and the third liner 321.

Figure 26:
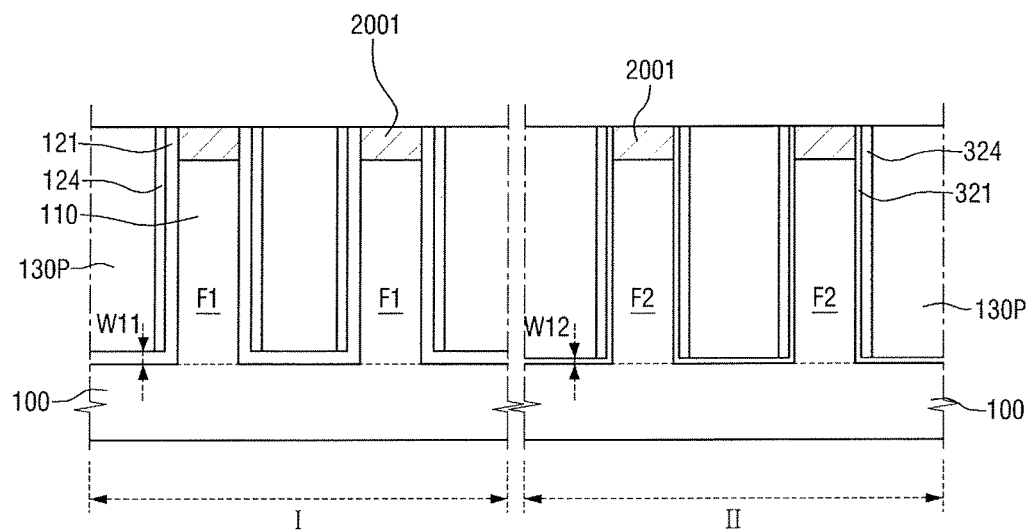

Next, referring to FIG. 26, a pre-isolation layer 130P may be formed on the first dual liners 121 and 124 and the second dual liners 321 and 324.

Then, a planarization process may be performed so that top surfaces of the first dual liners 121 and 124 and the second dual liners 321 and 324 are positioned to be coplanar with a top surface of the pre-isolation layer 130P. As the result of the performing of the planarization process, the first mask pattern 2001 may be partially removed, but aspects of the present inventive concept are not limited thereto.

The first mask pattern 2001 may be removed prior to the forming of the pre-isolation layer 130P or after performing a recess process to later be described with reference to FIG. 27.

Figure 27:
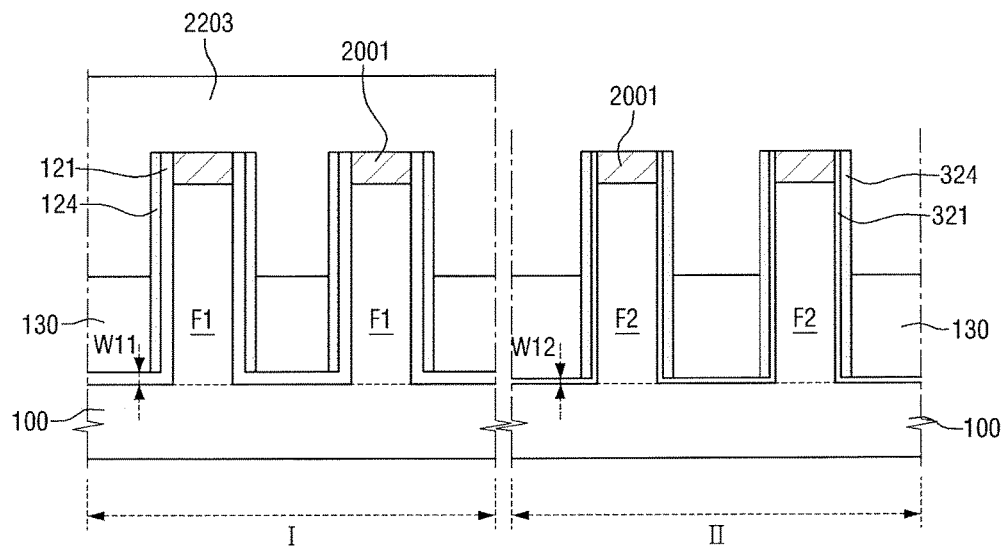
Figure 28:
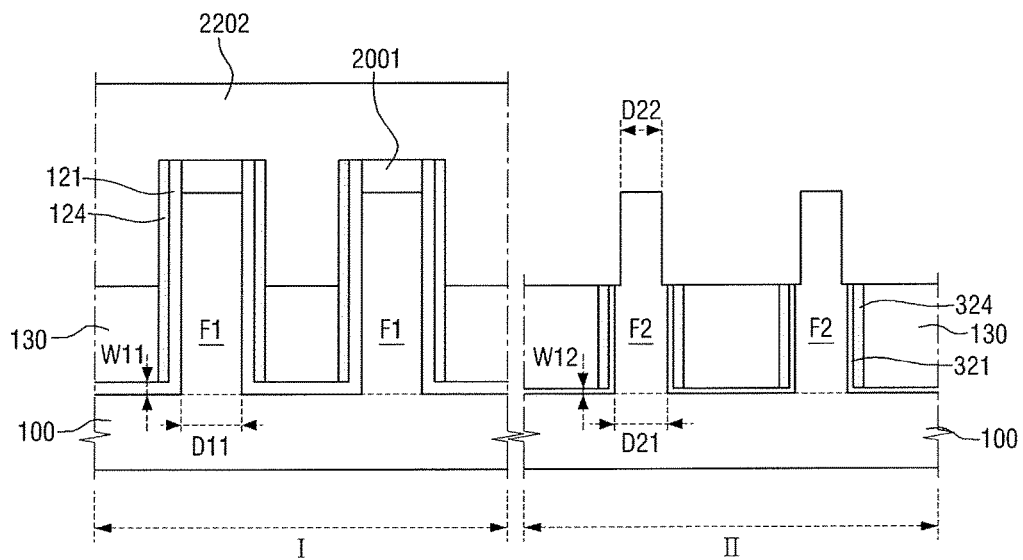

Next, referring to FIG. 27, a top portion of the pre-isolation layer 130P may be recessed to expose top portions of the first dual liners 121 and 124 and the second dual liners 321 and 324.

Then, a second mask pattern 2202 covering only the first region I may be formed.

Next, top portions of the second dual liners 321 and 324 may be recessed to expose a top portion of the second fin F2. As the result, a top surface of the isolation layer 130 may become coplanar with the top surfaces of the second dual liners 321 and 324, but aspects of the present inventive concept are not limited thereto.

Next, the top portion of the second fin F2 may be trimmed by an etching process. As the result, a top portion width of the second fin F2 may be reduced in width while a bottom portion width thereof remains the same.

Accordingly, a second width D21 of the bottom portion of the second fin F2 may be equal to a first width D11 of the first fin F1 formed on the first region I and a third width D22 of the top portion of the second fin F2 may be smaller than the first width D11 of the first fin F1 to prevent a fin critical dimension (FIN CD) between a transistor of the first region I and a transistor of the second region II from being changed as an epitaxial layer 340 is formed on the second fin F2 in a subsequent process.

Figure 29:
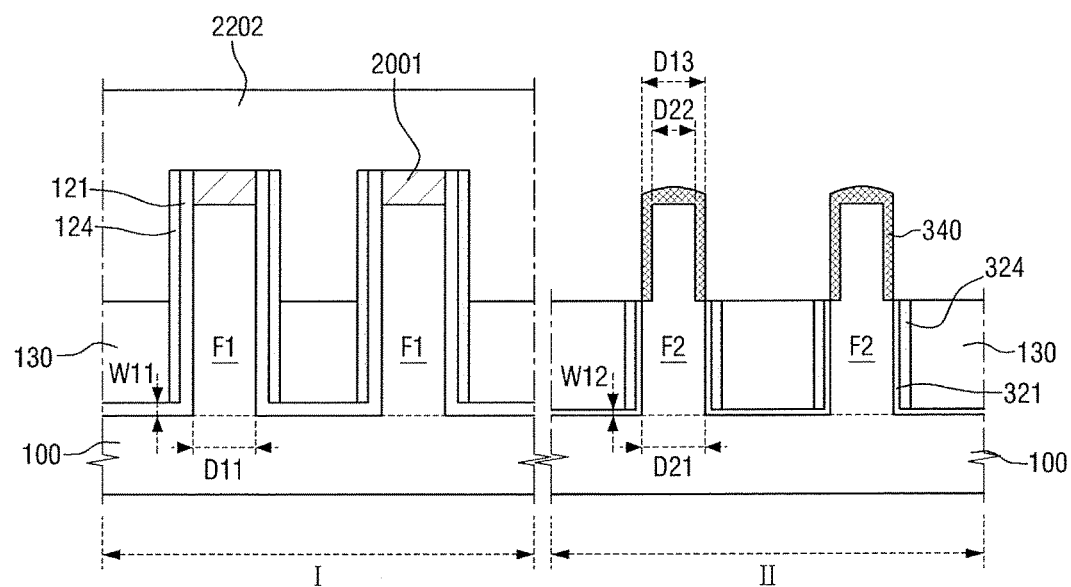

Next, referring to FIG. 29, an epitaxial layer 340 may be formed on the second fin F2. The epitaxial layer 340 may be formed to surround the top portion of the second fin F2. The epitaxial layer 340 may be formed along a profile of a protruding part of the second fin F2. For example, the epitaxial layer 340 may be formed to have a constant thickness along the protruding part of the second fin F2, but aspects of the present inventive concept are not limited thereto. For example, the epitaxial layer 340 may be thicker at a corner of the second fin F2. For example, the epitaxial layer 340 may be thicker at a top surface of the second fin F2.

In addition, the epitaxial layer 340 may include SiGe. The epitaxial layer 340 may be formed to be in contact with the third liner 321. In addition, the epitaxial layer 340 may be in contact with the fourth liner 324, but aspects of the present inventive concept are not limited thereto.

Figure 30:
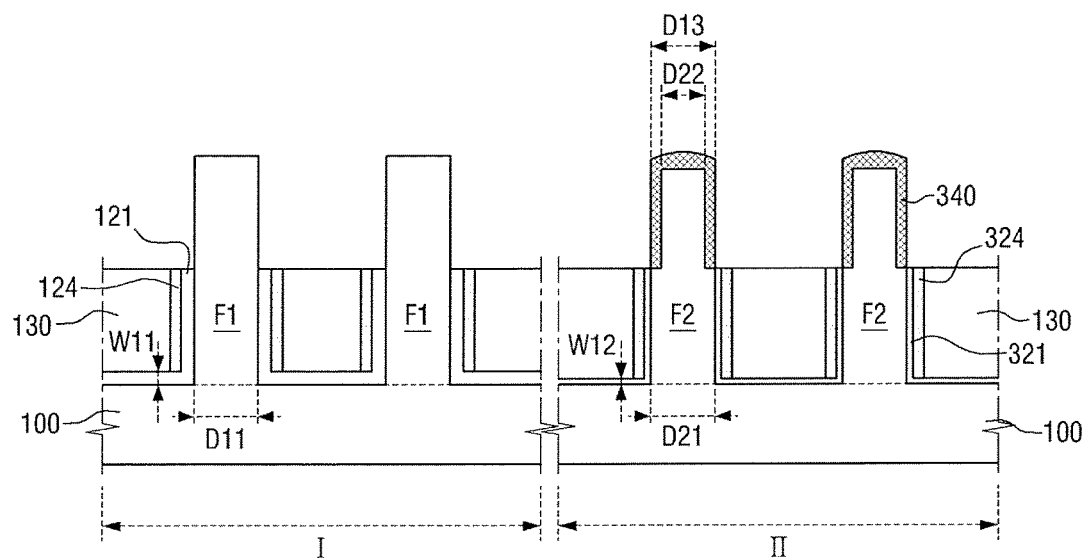

Next, referring to FIG. 30, the second mask pattern 2202 covering only the first region I, and the top portions of the first dual liners 121 and 124, may be removed to expose the top portion of the first fin F1. As the result, the top surface of the isolation layer 130 and the top surface of the first liner 121 may be coplanarly positioned, but aspects of the present inventive concept are not limited thereto.

Figure 31:
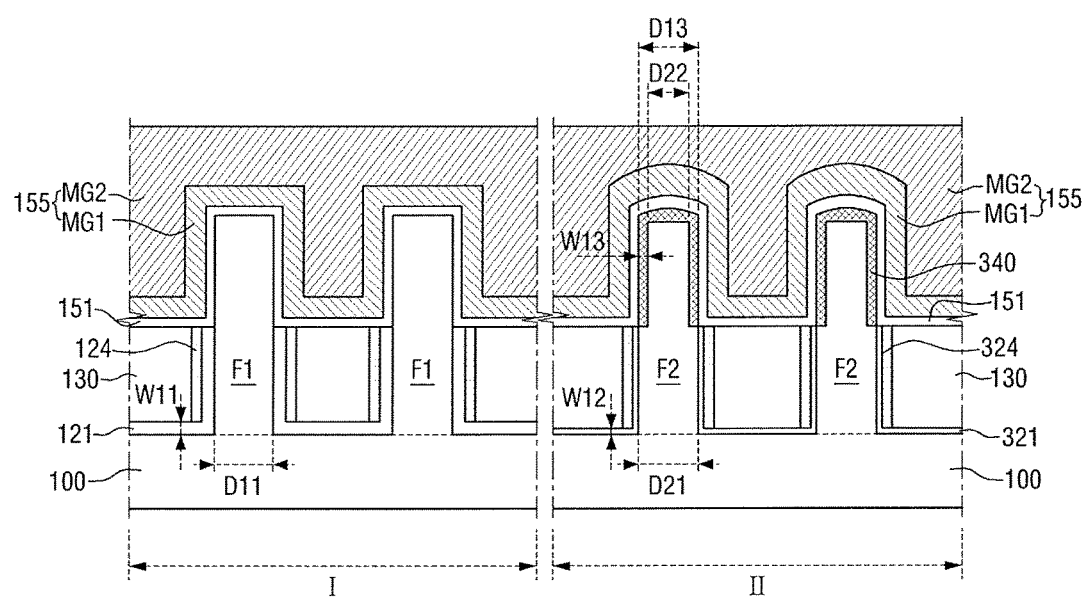

Next, referring to FIG. 31, a gate insulation layer 151 and a gate electrode 155 are formed on the first fin F1 and the second fin F2.

The gate electrode 155 may be formed on the gate insulation layer 151. The gate electrode 155 may include a conductive material. The gate electrode 155 may extend in a third direction Y1 intersecting the first fin F1 or in a fourth direction Y2 intersecting the second fin F2.

Figure 32:
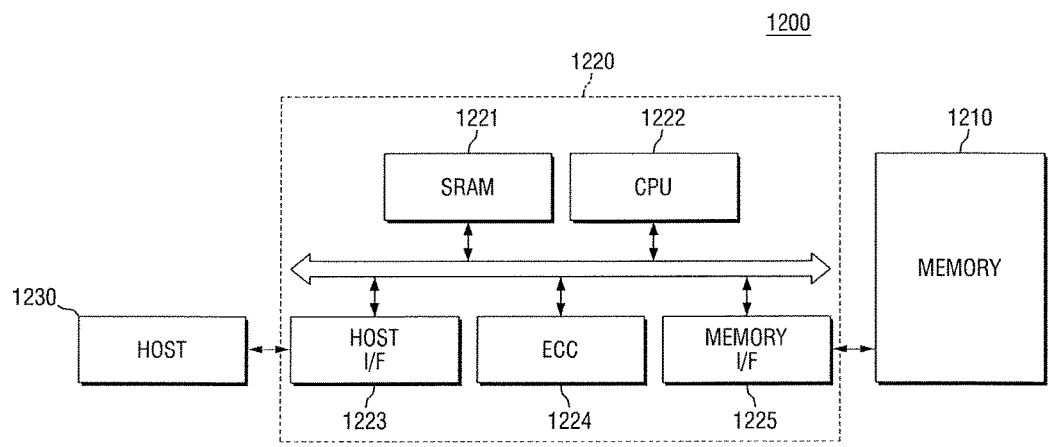
FIG. 32 is a block diagram of a memory card including a semiconductor device according to an exemplary embodiment of the present inventive concept.

FIG. 32 is a block diagram of a memory card including a semiconductor device according to an exemplary embodiment of the present inventive concept.

Referring to FIG. 32, a memory 1210 including a semiconductor device according to an exemplary embodiment may be employed in the memory card 1200. The memory card 1200 may include a memory controller 1220 controlling data exchange between a host 1230 and the memory 1210. A static random access memory (SRAM) 1221 may be used as an operating memory of a central processing unit 1222. A host interface 1223 may include a protocol for exchanging data by allowing the host 1230 to be connected to the memory card 1200. An error correction code (ECC) 1224 may be used to detect and correct an error of data read from the memory 1210. A memory interface (I/F) 1225 may interface with the memory 1210. The central processing unit 1222 may perform the overall control operation associated with the data exchange of the memory controller 1220.

Figure 33:
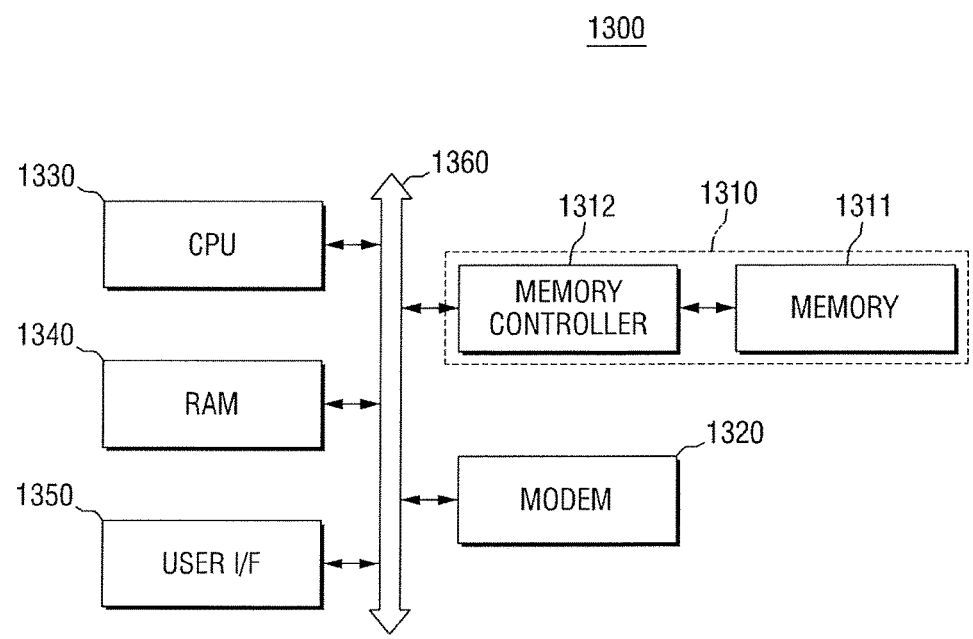
FIG. 33 is a block diagram of an information processing system including a semiconductor device manufactured by a semiconductor device manufacturing method according to an exemplary embodiment of the present inventive concept.

FIG. 33 is a block diagram of an information processing system including a semiconductor device manufactured by a semiconductor device manufacturing method according to an exemplary embodiment of the present inventive concept.

Referring to FIG. 33, the information processing system 1300 may include a memory system 1310 including a semiconductor device according to an exemplary embodiment of the present inventive concept. The information processing system 1300 may include a memory system 1310, a modem 1320, a central processing unit 1330, a random access memory (RAM) 1340 and a user interface (I/F) 1350, which are electrically connected to a system bus 1360. The memory system 1310 may include a memory 1311 and a memory controller 1312 and may have substantially the same configuration as that of the memory card 1200 shown in FIG. 15. The data processed by the central processing unit 1330 or the data received from an external device may be stored in the memory system 1310. The information processing system 1300 may be applied to a memory card, a solid state disk (SSD), a camera image sensor and other various chip sets. For example, the memory system 1310 may employ an SSD. In this case, the information processing system 1300 may process a large amount of data in a stable, reliable manner.

Figure 34:
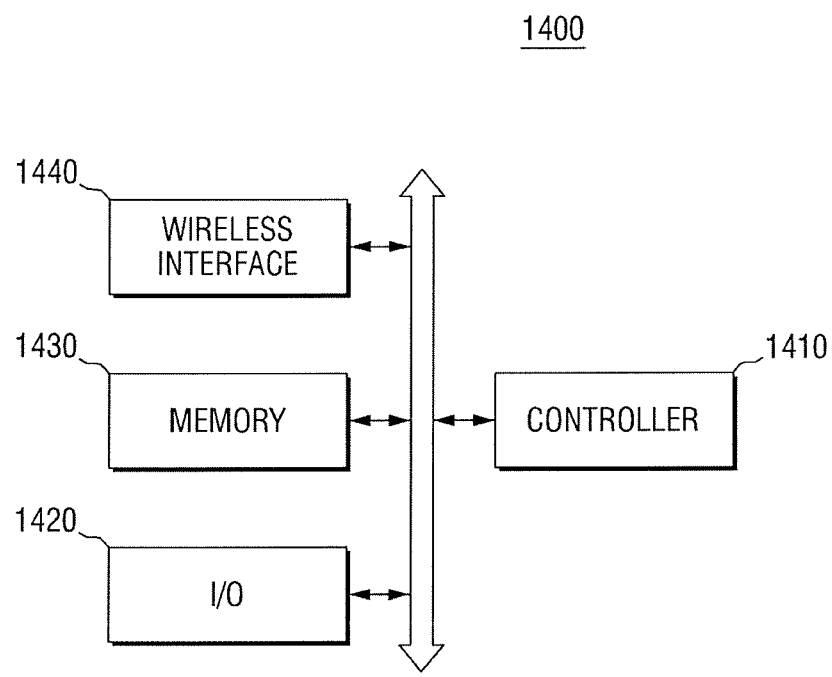
FIG. 34 is a block diagram of an electronic device including a semiconductor device manufactured by a semiconductor device manufacturing method according to an exemplary embodiment of the present inventive concept.

FIG. 34 is a block diagram of an electronic device including a semiconductor device manufactured by a semiconductor device manufacturing method according to an exemplary embodiment of the present inventive concept.

Referring to FIG. 34, the electronic device 1400 may include a semiconductor device manufactured according to an exemplary embodiment of the present inventive concept. The electronic device 1400 may be applied to a wireless communication device, such as a personal digital assistant (PDA), a portable computer, a web tablet, a wireless phone, a mobile phone, and/or a digital music player, or any type of electronic device capable of transmitting and/or receiving information in a wireless environment.

The electronic device 1400 may include a controller 1410, an input/output device (I/O) 1420, a memory 1430, and a wireless interface 1440. Here, the memory 1430 may include a semiconductor device manufactured by a semiconductor device manufacturing method according to an exemplary embodiment of the present inventive concept. The controller 1410 may include a microprocessor, a digital signal processor, or the like. The memory 1430 may store commands (or user data). The wireless interface 1440 may perform functions of transmitting data to a communication network or receiving data from the communication network. The wireless interface 1140 may be wired or wireless. For example, the interface 1140 may include an antenna or a wired/wireless transceiver, and so on. The electronic device 1400 may employ a third-generation communication system protocol, such as Code Division Multiple Access (CDMA), Global System for Mobile Communication (GSM), North American Digital Cellular (NADC), Extended Time Division Multiple Access (E-TDMA), Wideband Code Division Multiple Access (WCDMA), or Code Division Multiple Access 2000 (CDMA2000).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   a substrate including a first region and a second region;
   a first fin on the first region, the first fin extending in a first direction;
   a second fin on the second region, the second fin extending in a second direction;
   a first dual liner on a lateral surface of the first fin,
   wherein the first dual liner includes a first liner and a second liner and
   wherein the first liner is interposed between the second liner and the lateral surface of the first fin;
   a second dual liner on a lateral surface of the second fin,
   wherein the second dual liner includes a third liner and a fourth liner and
   wherein the third liner is interposed between the fourth liner and the lateral surface of the second fin; and
   an epitaxial layer surrounding a top portion of the second fin,
   wherein each of the first and second fins include a single layer,
   wherein a first width of the first fin is greater than a first width of the second fin, and
   wherein the first liner and the third liner have different thicknesses.

2. The semiconductor device of claim 1,
   wherein a thickness of the second liner is equal to a thickness of the fourth liner.

3. The semiconductor device of claim 1, further comprising an isolation layer formed on the second liner or the fourth liner,
   wherein the isolation layer is in contact with a portion of the first liner or a portion of the third liner.

4. The semiconductor device of claim 1,
   wherein the second liner and the fourth liner include the same material, the first liner is conformally formed on sidewalls of the first fin and on the substrate, and the third liner is conformally formed on sidewalls of the second fin and on the substrate.

5. The semiconductor device of claim 4,
   wherein the first liner and the third liner include silicon oxide and the second liner and the fourth liner include silicon nitride.

6. The semiconductor device of claim 1,
   wherein a bottom surface of the epitaxial layer is in contact with the third liner.

7. The semiconductor device of claim 1,
   wherein a bottom surface of the epitaxial layer is spaced apart from the fourth liner.

8. The semiconductor device of claim 1,
   wherein the epitaxial layer is in contact with a protruding part of the second fin and the epitaxial layer covers the protruding part of the second fin.

9. The semiconductor device of claim 8,
   wherein the epitaxial layer includes SiGe.

10. The semiconductor device of claim 1,
wherein the first region includes an NMOS transistor and the second region includes a PMOS transistor.

11. The semiconductor device of claim 1,
wherein the first liner and the third liner have different thicknesses.

12. A semiconductor device comprising:
a substrate including a first region and a second region;
a first fin on the first region, the first fin extending in a first direction;
a second fin on the second region, the second fin extending in a second direction;
a first dual liner on a lateral surface of the first fin,
wherein the first dual liner includes a first liner and a second liner, and
wherein the first liner is interposed between the second liner and the lateral surface of the first fin;
a second dual liner on a lateral surface of the second fin,
wherein the second dual liner includes a third liner and a fourth liner and wherein the third liner is interposed between the fourth liner and the lateral surface of the second fin;
an epitaxial layer surrounding a top portion of the second fin;
a first gate structure being in contact with the first fin and intersecting the first fin in a third direction crossing the first direction; and
a second gate structure being in contact with a top surface of the epitaxial layer and intersecting the epitaxial layer in a fourth direction crossing the second direction,
wherein a first width of the second fin is different from a first width of the first fin, and
wherein the first width of the first fin is measured at a first height above a top surface of the first dual liner and the first width of the second fin is measured at a second height above a top surface of the second dual liner, and
wherein the top surface of the first dual liner is lower than the top surface of the first fin and the top surface of the second dual liner is lower than the top surface of the second fin.

13. The semiconductor device of claim 12,
wherein the first width of the second fin is smaller than the first width of the first fin.

14. The semiconductor device of claim 13,
wherein the epitaxial layer is in contact with a top surface of the third liner.

15. The semiconductor device of claim 12,
wherein the first width of the second fin is different from a second width of the second fin,
wherein the second width of the second fin is measured at a fourth height blow the top surface of the second dual liner.

16. The semiconductor device of claim 15,
wherein the epitaxial layer is spaced apart from a top surface of the fourth liner.

17. A semiconductor device comprising:
a substrate including a first region and a second region;
a first fin on the first region, the first fin extending in a first direction;
a second fin on the second region, the second fin extending in a second direction;
a first liner on a lateral surface of the first fin, wherein the first liner is in contact with the lateral surface of the first fin;
a second liner on a lateral surface of the second fin, wherein the second liner is in contact with the lateral surface of the second fin; and
an epitaxial layer surrounding a top portion of the second fin,
wherein the first liner and the second liner have different thicknesses and a first width of the second fin is different a first width of the first fin,
wherein the first width of the first fin is measured at a first height above a top surface of the first liner,
wherein each of the first and second fins include a single layer, and
wherein the first width of the second fin is measured at a second height above a top surface of the second liner.

18. The semiconductor device of claim 17,
wherein the first liner and the second liner have different thicknesses,
wherein a first width of the first fin is greater than a first width of the second fin,
wherein the first width of the first fin is measured at a first height above a top surface of the first liner, and
wherein the first width of the second fin is measured at a second height above a top surface of the second liner.

19. The semiconductor device of claim 17,
wherein a second width of the first fin is equal to a second width of the second fin,
wherein the second width of the first fin is measured at a third height below the top surface of the first liner, and
wherein the second width of the second fin is measured at a fourth height below the top surface of the second liner.

20. The semiconductor device of claim 17, further comprising:
a third liner formed on the first liner and the second liner; and
an isolation layer formed on the first liner and the second liner,
wherein the first liner and the second liner include silicon oxide and the third liner includes silicon nitride, and
wherein the third liner is interposed between the isolation layer and the first liner and between the isolation layer and the second liner.

* * * * *